*(12)* United States Patent
Hartig et al.

(10) Patent No.: US 7,037,589 B2
(45) Date of Patent: May 2, 2006

(54) THIN FILM COATING HAVING NIOBIUM-TITANIUM LAYER

(75) Inventors: Klaus Hartig, Avcoa, WI (US); Annette J. Krisko, Prairie de Sac, WI (US)

(73) Assignee: Cardinal CG Company, Eden Prairie, MN (US)

( * ) Notice: Subject to any disclaimer, the term of this patent is extended or adjusted under 35 U.S.C. 154(b) by 250 days.

(21) Appl. No.: 10/123,032

(22) Filed: Apr. 11, 2002

(65) Prior Publication Data

US 2003/0165694 A1 Sep. 4, 2003

Related U.S. Application Data

(63) Continuation-in-part of application No. 10/087,662, filed on Mar. 1, 2002, now Pat. No. 6,919,133.

(51) Int. Cl.
*B32B 9/00* (2006.01)

(52) U.S. Cl. .................. 428/429; 428/432; 428/446; 428/448; 428/697; 428/698; 428/699; 428/701; 428/704

(58) Field of Classification Search ............... 428/428, 428/429, 432, 446, 448, 697, 698, 699, 701, 428/704; 204/192.1, 192.11, 192.12, 192.14, 204/192.15, 192.16, 192.26, 192.27, 192.28
See application file for complete search history.

(56) References Cited

U.S. PATENT DOCUMENTS

| | | | |
|---|---|---|---|
| 3,885,855 A | 5/1975 | Gross | |
| 3,962,488 A | 6/1976 | Gillery | |
| 4,019,887 A | 4/1977 | Kirkbride et al. | ............... 65/60 |
| 4,045,125 A | 8/1977 | Farges | |
| 4,100,330 A | 7/1978 | Donley | ............... 428/429 |
| 4,166,018 A | 8/1979 | Chapin | |
| 4,188,444 A | 2/1980 | Landau | ............... 428/428 |
| 4,188,452 A | 2/1980 | Groth | ............... 428/336 |
| 4,462,883 A | 7/1984 | Hart | |
| 4,485,146 A | 11/1984 | Mizuhashi et al. | ......... 428/428 |
| 4,610,771 A | 9/1986 | Gillery | |
| 4,619,729 A | 10/1986 | Johncock et al. | |
| 4,737,252 A | 4/1988 | Hoffman | |
| 4,737,379 A | 4/1988 | Hudgens et al. | |
| 4,773,717 A | 9/1988 | Pai et al. | |
| 4,790,922 A | 12/1988 | Huffer | |
| 4,806,220 A | 2/1989 | Finley | |
| 4,847,157 A | 7/1989 | Goodman et al. | .......... 428/426 |
| 4,859,532 A | 8/1989 | Oyama et al. | |
| 4,894,290 A | 1/1990 | Chesworth et al. | |
| 4,902,081 A | 2/1990 | Huffer | |
| 4,919,778 A | 4/1990 | Dietrich et al. | |
| 4,946,712 A | 8/1990 | Goodman et al. | .......... 427/166 |
| 4,996,105 A | 2/1991 | Oyama et al. | |
| 5,000,528 A | 3/1991 | Kawakatsu | |
| 5,135,808 A | 8/1992 | Kimock et al. | |
| 5,153,054 A | 10/1992 | Depauw et al. | |

(Continued)

FOREIGN PATENT DOCUMENTS

CA 2115320 8/1994

(Continued)

*Primary Examiner*—Deborah Jones
*Assistant Examiner*—G. Blackwell
(74) *Attorney, Agent, or Firm*—Fredrikson & Byron, P.A.

(57) ABSTRACT

The invention provides niobium-titanium films, coatings (e.g., low-emissivity coatings) comprising one or more niobium-titanium films, and substrates bearings such coatings. Methods of depositing niobium-titanium films are also provided.

67 Claims, 10 Drawing Sheets

U.S. PATENT DOCUMENTS

| | | | |
|---|---|---|---|
| 5,168,003 A | 12/1992 | Proscia | |
| 5,190,807 A | 3/1993 | Kimock et al. | |
| 5,201,926 A | 4/1993 | Szczyrbowski et al. | |
| 5,268,217 A | 12/1993 | Kimock et al. | |
| 5,279,722 A | 1/1994 | Szczyrbowski et al. | |
| 5,288,527 A | 2/1994 | Jousse et al. | |
| 5,296,302 A | 3/1994 | O'Shaughnessy et al. | |
| 5,302,449 A | 4/1994 | Eby et al. | |
| 5,308,706 A | 5/1994 | Kawaguchi et al. | |
| 5,318,685 A | 6/1994 | O'Shaughnessy et al. | |
| 5,328,768 A | 7/1994 | Goodwin | 428/428 |
| 5,337,191 A | 8/1994 | Austin | |
| 5,344,718 A | 9/1994 | Hartig et al. | |
| 5,372,874 A | 12/1994 | Dickey et al. | |
| 5,394,269 A | 2/1995 | Takamatsu et al. | |
| 5,411,794 A | 5/1995 | Kawaguchi et al. | |
| 5,424,130 A | 6/1995 | Nakanishi et al. | |
| 5,505,989 A | 4/1996 | Jenkinson | |
| 5,508,092 A | 4/1996 | Kimock et al. | |
| 5,510,173 A | 4/1996 | Pass et al. | |
| 5,520,996 A | 5/1996 | Balian et al. | 428/216 |
| 5,578,103 A | 11/1996 | Araujo et al. | 65/60.5 |
| 5,580,364 A | 12/1996 | Goodman et al. | |
| 5,635,245 A | 6/1997 | Kimock et al. | 427/249 |
| 5,637,353 A | 6/1997 | Kimock et al. | 427/255.3 |
| 5,645,699 A | 7/1997 | Sieck | |
| 5,688,585 A | 11/1997 | Lingle et al. | |
| 5,718,980 A | 2/1998 | Koch et al. | |
| 5,745,291 A | 4/1998 | Jenkinson | |
| 5,749,931 A | 5/1998 | Goodman et al. | |
| 5,756,192 A | 5/1998 | Crawley et al. | 428/216 |
| 5,763,063 A | 6/1998 | Pass et al. | |
| 5,834,103 A | 11/1998 | Bond et al. | |
| 5,876,854 A | 3/1999 | Kawazu et al. | 428/428 |
| 5,891,556 A | 4/1999 | Anderson et al. | 428/216 |
| 5,935,702 A | 8/1999 | Macquart et al. | |
| 5,938,958 A | 8/1999 | Goodman et al. | |
| 5,962,115 A | 10/1999 | Zmelty et al. | |
| 5,976,678 A | 11/1999 | Kawazu et al. | 428/208 |
| 6,001,485 A | 12/1999 | Kobayashi et al. | 428/428 |
| 6,007,901 A | 12/1999 | Maschwitz et al. | |
| 6,045,896 A | 4/2000 | Boire et al. | |
| 6,060,178 A | 5/2000 | Krisko | |
| 6,068,914 A | 5/2000 | Boire et al. | 428/216 |
| 6,071,623 A | 6/2000 | Sugawara et al. | 428/428 |
| 6,086,210 A | 7/2000 | Krisko et al. | |
| 6,090,481 A | 7/2000 | Depauw et al. | 428/336 |
| 6,139,969 A | 10/2000 | Finley | 428/432 |
| 6,210,784 B1 | 4/2001 | Rondeau et al. | |
| 6,231,999 B1 | 5/2001 | Krisko | |
| 6,316,111 B1 | 11/2001 | Krisko | 428/434 |
| 6,322,881 B1 | 11/2001 | Boire et al. | |
| 6,346,174 B1 * | 2/2002 | Finley et al. | 204/192.15 |
| 6,524,688 B1 | 2/2003 | Eby et al. | 428/216 |
| 6,585,871 B1 * | 7/2003 | Anzaki et al. | 204/298.14 |
| 2002/0102352 A1 | 8/2002 | Hartig et al. | 427/165 |
| 2003/0180547 A1 * | 9/2003 | Buhay et al. | 428/434 |

FOREIGN PATENT DOCUMENTS

| | | |
|---|---|---|
| DE | 39 41 026 A1 | 7/1990 |
| DE | 39 06 374 A1 | 9/1990 |
| DE | 39 42 990 A1 | 6/1991 |
| DE | 42 11 363 A1 | 10/1993 |
| DE | 195 33 053 C1 | 4/1997 |
| EP | 0 104 870 A2 | 4/1984 |
| EP | 0 343 695 B1 | 11/1989 |
| EP | 0 275 662 B1 | 11/1990 |
| EP | 0 464 701 A2 | 1/1992 |
| EP | 0 303 109 B1 | 3/1992 |
| EP | 0 543 077 A1 | 5/1993 |
| EP | 0 622 645 A1 | 11/1994 |
| EP | 0 636 587 A2 | 2/1995 |
| EP | 0 718 250 A2 | 6/1996 |
| EP | 0 722 913 B1 | 7/1996 |
| EP | 0 583 871 B1 | 11/1996 |
| EP | 0 761 618 A1 | 3/1997 |
| EP | 0 747 330 B1 | 4/1999 |
| GB | 2 031 756 A | 10/1978 |
| GB | 2 129 831 A | 9/1983 |
| GB | 2 126 256 A | 3/1984 |
| GB | 2 186 001 A | 8/1987 |
| JP | 11157881 | 12/1997 |
| WO | WO 84/02128 | 6/1984 |
| WO | WO 91/10564 | 7/1991 |
| WO | WO 91/14016 | 9/1991 |
| WO | WO 95/13189 | 5/1995 |
| WO | WO 97/48649 | 12/1997 |
| WO | WO 00/32530 | 6/2000 |
| WO | WO 01/44131 | 12/2000 |

* cited by examiner

THIN FILM COATING HAVING NIOBIUM-TITANIUM LAYER

CROSS REFERENCE TO RELATED APPLICATIONS

The present application is a continuation-in-part of patent application filed Mar. 1, 2002 and assigned Ser. No. 10/087,662, now U.S. Pat. No. 6,919,133 the entire disclosure of which is incorporated herein by reference.

FIELD OF THE INVENTION

The present invention relates generally to transparent coatings for glass and other substrates. More specifically, the invention relates to coatings that are capable of withstanding high temperatures such as those encountered during glass tempering.

BACKGROUND OF INVENTION

Glass sheets and other substrates can be coated with a stack of transparent, metal-containing films to vary the optical properties of the coated substrates. Particularly desirable are coatings characterized by their ability to readily transmit visible light while minimizing the transmittance of other wavelengths of radiation, especially radiation in the infrared spectrum. These characteristics are useful for minimizing radiative heat transfer without impairing visible transmission. Coated glass of this nature is useful as architectural glass and as automotive glass.

Coatings having the characteristics of high visible transmittance and low emissivity typically include one or more infrared-reflective films and two or more antireflective transparent dielectric films. The infrared-reflective films, which are typically conductive metals such as silver, gold, or copper, reduce the transmission of radiant heat through the coating. The transparent dielectric films are used primarily to reduce visible reflection, to provide mechanical and chemical protection for the sensitive infrared-reflective films, and to control other optical coating properties, such as color. Commonly used transparent dielectrics include oxides of zinc, tin, and titanium, as well as nitrides of silicon, chromium, zirconium, and titanium. Low-emissivity coatings are commonly deposited on glass sheets through the use of well known magnetron sputtering techniques.

It is often necessary to heat coated glass sheets to temperatures at or near the melting point of glass to temper the glass or to enable it to be bent into desired shapes, such as curved automobile windshields. Tempering is important for glass used in automobile windows, and particularly for glass used in automobile windshields. Upon breaking, tempered glass desirably exhibits a break pattern in which the glass shatters into a great many small pieces, rather than into large dangerous shards. During tempering, coated glass is typically subjected to elevated temperatures on the order of about 700 degrees C. Moreover, coated glass often must be able to withstand such temperatures for substantial periods of time. Film stacks employing silver as the infrared-reflective film often cannot withstand such high temperature processing without some deterioration of the silver film.

To avoid this problem, glass sheets can be heated and bent or tempered before they are coated. The desired films can then be applied after heating. However, this procedure tends to be complicated and costly and, more problematically, may produce non-uniform coatings.

Another reported method for protecting a reflective silver film from deterioration at high temperatures involves sandwiching the silver between protective films of an oxidizable and/or nitridable metal (e.g., titanium). The protective films are thick enough and reactive enough that when the coated glass is heated to high temperatures, these films capture oxygen and/or nitrogen that might otherwise reach and react with the silver. During heat treatment, the atoms in the originally flat silver film become particularly mobile, and even more so after being activated by presence of oxygen. As a result, the silver may begin growing hillocks, which may ultimately lead to the formation of isolated metal islands (clusters). This will generally create an unacceptable amount of visible haze, reduce infrared reflection, and increase emissivity. Reference is made to U.S. Pat. No. 4,790,922, (Huffer et al.), U.S. Pat. No. 4,806,220 (Finley), and U.S. Pat. No. 3,962,488 (Gillery), the entire teachings of each of which are incorporated herein by reference.

It is also known to provide a single protective titanium layer directly over an infrared-reflective silver film to protect the silver film during deposition of a subsequent oxide layer. Protective titanium layers have been found to impart excellent scratch resistance in the low-emissivity coatings into which they are incorporated. However, low-emissivity coatings having titanium protective layers tend to change noticeably in color (i.e., they tend to color shift) when tempered. As a result, glass bearing such a coating tends to exhibit a noticeably different color before being tempered than it does after being tempered. This can have undesirable consequences for quality control, as the final appearance of the product tends to show up only after tempering, which may be performed at a separate location and at a later time. This creates difficulties for feedback to control the production process.

To ensure that tempered and non-tempered panes have uniform appearance, the temperable coating is designed to have substantially the same appearance following tempering as the normal appearance of the non-temperable coating. Temperable coatings are generally not used without first being tempered, as these coatings may only reach their desired appearance (i.e., their final specification) after they have been tempered. It is preferable to provide coatings that change as little as possible in color and other properties during tempering and other heat treatments.

U.S. Pat. Nos. 6,060,178 and 6,231,999 (both issued to Krisko), the entire contents of each of which are incorporated herein by reference, disclose low-emissivity coatings that employ niobium protective layers. Low-emissivity coatings having niobium protective layers are particularly advantageous in that they show minimal shifts in properties (e.g., color shift) when tempered or otherwise heat treated. However, it has been discovered that low-emissivity coatings having niobium protective layers are less scratch resistant than otherwise equivalent coatings having titanium protective layers.

It would be desirable to provide a protective layer that imparts in low-emissivity coatings both scratch resistance and resistance to the color shifting that can occur during tempering and other heat treatments. It would be particularly desirable to provide a protective layer that imparts these characteristics, yet can be incorporated into low-emissivity coatings at an affordable cost.

SUMMARY OF THE INVENTION

The present invention provides a transparent, heat-resistant article comprising a substrate and a transparent film stack deposited upon the substrate. The heat-resistant article may be a glass article, such as a coated glass pane, an insulating glass unit, or an assembled window. The transparent film stack preferably includes an infrared-reflective film and a protective layer comprising both niobium and titanium. Preferably, this protective layer is contiguous to (i.e., in direct contact with) the infrared-reflective film. The niobium-titanium in the protective layer can be an alloy or mixture comprising niobium and titanium. In some embodiments, the niobium-titanium layer has been at least partially oxidized, and/or at least partially nitrided, to form an oxide and/or nitride of the niobium-titanium alloy or mixture. The transparent film stack may include one, two, or more infrared-reflective films, at least one of which is provided with an overlying or underlying protective niobium-titanium layer. In certain embodiments, each infrared-reflective film in the transparent film stack is provided with an overlying protective niobium-titanium layer. Each protective niobium-titanium layer may have a thickness of up to about 30 angstroms. Preferably, each protective layer has a thickness of between about 10 angstroms and about 30 angstroms, more preferably between about 15 angstroms and about 22 angstroms, and perhaps optimally about 20 angstroms.

One embodiment of the invention provides a substrate bearing a low-emissivity coating. The low-emissivity coating in this embodiment comprises, moving outwardly, a first film layer comprising a transparent dielectric material, a second film layer comprising an infrared-reflective material, a third, protective film layer comprising niobium and titanium, and a fourth film layer comprising a transparent dielectric material.

In another embodiment, the invention provides a substrate bearing a low-emissivity coating that includes one or more infrared-reflective films. The low-emissivity coating in this embodiment includes a protective niobium-titanium layer that is contiguous with a protected infrared-reflective film of the coating.

In still another embodiment, the invention provides a transparent substrate having a first index of refraction. The substrate bears a low-emissivity coating comprising, moving outwardly, a transparent base layer comprising amorphous material having a second index of refraction that is substantially equal to the first index of refraction of the substrate, a second film layer comprising a transparent dielectric material, a third film layer comprising an infrared-reflective material, a fourth, protective film layer comprising niobium and titanium, and a fifth film layer comprising a transparent dielectric material.

In yet another embodiment, the invention provides a substrate bearing a low-emissivity coating. The low-emissivity coating in this embodiment comprises, moving outwardly, a first film layer comprising a transparent dielectric material, a second film layer comprising an infrared-reflective material, an intermediate film region comprising at least three film layers, a sixth film layer comprising an infrared-reflective material, and a seventh film layer comprising a transparent dielectric material. In this particular embodiment, the low-emissivity coating includes a protective niobium-titanium layer that is contiguous either to the second film layer or to the sixth film layer.

A further embodiment of the invention provides a substrate bearing a low-emissivity coating. The low-emissivity coating in this embodiment comprises, moving outwardly, a first film layer comprising an oxide of zinc and tin, a second film layer comprising an oxide of zinc alone, a third film layer comprising an infrared-reflective material, a fourth film layer comprising niobium and titanium formed directly upon the third film layer, a fifth film layer comprising an oxide of zinc alone, a sixth film layer comprising an oxide of zinc and tin, a seventh film layer comprising an oxide of zinc alone, an eighth film layer comprising an infrared-reflective material, a ninth film layer comprising niobium and titanium formed directly upon the eighth film layer, a tenth film layer comprising an oxide of zinc alone, an eleventh film layer comprising an oxide of zinc and tin; and a twelfth film layer comprising a transparent dielectric material.

In another embodiment, the invention provides a substrate bearing a low-emissivity coating. The low-emissivity coating in this embodiment comprises, moving outwardly from the substrate, a first film layer comprising an oxide of titanium, a second film layer comprising an oxide of zinc alone, a third film layer comprising an infrared-reflective material, a fourth film layer comprising niobium and titanium formed directly upon the third film layer, a fifth film layer comprising silicon nitride, a sixth film layer comprising an oxide of zinc alone, a seventh film layer comprising an infrared-reflective material, an eighth film layer comprising niobium and titanium formed directly upon the seventh film layer, and a ninth film layer comprising a transparent dielectric material.

In still another embodiment, the invention provides a method of depositing a niobium-titanium layer having abrasion resistance and resistance to color shifting during elevated temperature processing. The method comprises providing a niobium-containing sputtering target and a titanium-containing sputtering target. Both targets are positioned in a sputtering chamber having a sputtering cavity in which a controlled environment can be established. Electric charge is delivered to both targets to sputter niobium and titanium onto a substrate having a major surface oriented toward the targets, thereby depositing niobium-titanium film upon this major surface of the substrate or upon a film layer previously deposited upon this major surface of the substrate.

DETAILED DESCRIPTION OF PREFERRED EMBODIMENTS

Figure 1:
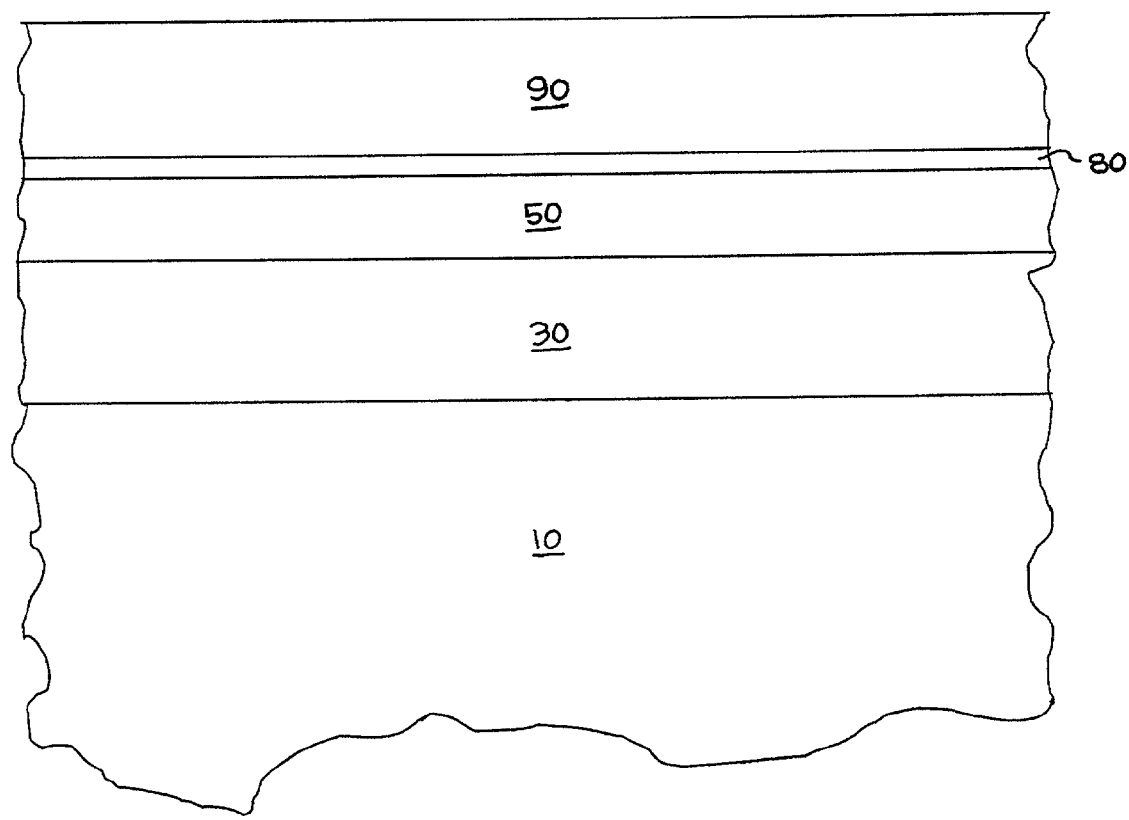
FIG. 1 is a schematic, cross sectional view of a substrate carrying a film stack in accordance with one embodiment of the present invention.

The following detailed description is to be read with reference to the drawings, in which like elements in different drawings have been given like reference numerals. The drawings, which are not necessarily to scale, depict selected embodiments and are not intended to limit the scope of the invention. Skilled artisans will recognize that the examples provided herein have many suitable alternatives that can be utilized, and which fall within the scope of the invention.

The present invention provides coatings that include at least one niobium-titanium layer. The niobium-titanium layer has utility in a wide variety of coatings. For example, particular utility is anticipated for low-emissivity coatings, especially silver-based low-emissivity coatings (i.e., low-emissivity coatings that include at least one silver-containing infrared-reflective film). Presently, it is contemplated that the niobium-titanium layer will bestow the greatest benefit upon heat-treatable low-emissivity coatings, by imparting in these coatings both scratch resistance and resistance to the color shift that can occur during tempering and other heat treatments.

Substrates suitable for use in connection with the present invention include the substrate class comprising generally flat, sheet-like substrates. A substrate of this nature typically has two generally-opposed major surfaces. In most cases, the substrate will be a sheet of transparent material (i.e., a transparent sheet). For example, the substrate may be a sheet of glass. One type of glass that is commonly used in manufacturing glass articles (e.g., insulating glass units) is soda-lime glass. Soda-lime glass will be a preferred substrate in many cases. Of course, other types of glass can be used as well, including those generally referred to as alkali-lime-silicon dioxide glass, phosphate glass, and fused silicon dioxide. It is noted that the substrate is not required to be transparent. For example, opaque substrates may be useful in some cases. However, it is anticipated that for most applications, the substrate will comprise a transparent or translucent material, such as glass or clear plastic.

With reference to FIG. 1, there is illustrated one embodiment of the invention involving a low-emissivity coating. As low-emissivity coatings are well known in the present art, those skilled in this art would be able to readily select and vary the precise nature (e.g., composition, thickness, and deposition process) of the various films in these coatings. Thus, it should be appreciated that the low-emissivity film stack embodiments described and illustrated herein are merely exemplary. It should also be appreciated that the invention extends to any low-emissivity coating that includes at least one niobium-titanium layer, regardless of the position of the niobium-titanium layer in the coating. Presently, it is contemplated that using the niobium-titanium layer over or under an infrared-reflective film (e.g., silver) will bestow greatest benefit.

In the embodiment of FIG. 1, the illustrated low-emissivity coating has only one infrared-reflective layer 50 (i.e., it is a "single" type low-emissivity coating). This layer 50 can be formed of any desired infrared-reflective material. For example, silver is the most commonly used infrared-reflective material. However, gold, copper, or any other infrared-reflective material can be used. Likewise, alloys or mixtures of these materials can be used. In many cases, it will be preferable to employ a silver or silver-containing layer 50. For example, one may provide an infrared-reflective layer in the form of silver combined with a small amount of gold (e.g., about 5% gold or less). Those skilled in the present art may prefer to utilize any of a number of other known types of silver-containing films.

With respect to low-emissivity coatings that have only a single infrared-reflective layer, the thickness of this layer 50 is preferably at least about 65 angstroms to provide a high level of infrared reflectivity. A lesser thickness, however, may be desired for certain applications. Typically, it is advantageous to select the thickness and material of the infrared-reflective film 50 so as to provide infrared reflectance values of above 60%, and more preferably above 85% (e.g., in the 3 to 10 micron range). Optimally, the coating is designed to achieve infrared reflectance values of nearly 100%, while still providing sufficient visual transmittance. In certain embodiments, the infrared-reflective layer 50 comprises silver at a thickness of between about 50 angstroms and about 180 angstroms. For example, silver at a thickness of about 80 angstroms is expected to give good results.

Oxygen is preferably prevented from coming into reactive contact with the infrared-reflective film 50. For example, silver is known to be highly sensitive to oxygen. When silver in a low-emissivity coating is exposed to reactive oxygen, unstable silver oxide may be formed as an intermediate reaction product. As noted above, volatile silver oxide undesirably increases the mobility of silver atoms. This can be particularly severe when the silver reacts with oxygen at an elevated temperature, such as during tempering. While infrared-reflective material may be less reactive with nitrogen, it may be desirable to prevent nitrogen from reaching the infrared-reflective film 50.

The present niobium-titanium layers suppress the mobility of silver atoms during heat-treatment. Thus, the niobium-titanium layers help to maintain a continuous silver film. The present niobium-titanium layer is well suited for preventing oxygen and/or nitrogen from reaching and reacting with an infrared-reflective film. Niobium and titanium both react with oxygen and nitrogen at high temperatures to form oxides and nitrides. Thus, a protective niobium-titanium layer is believed to be capable of chemically reacting with, and thus capturing, oxygen and nitrogen to form oxides and nitrides of the niobium-titanium.

It is surmised that when a film stack including oxide and/or nitride films is heated to glass tempering temperatures, the excess oxygen and/or nitrogen in these films may become mobile, and at such high temperatures would be very reactive. It is thought that this highly reactive oxygen and/or nitrogen will be captured by the protective niobium-titanium layer. As described in U.S. patent application Ser. No. 10/087,662, conventional glass tempering is commonly performed in an oxidizing atmosphere (e.g., air). The teachings of this '662 application are incorporated herein by reference, in particular for its description (at Example 1) of a conventional glass tempering process, wherein glass is treated at elevated temperatures reaching about 734 C. It is surmised that reactive oxygen from the atmosphere may penetrate the film stack during tempering. It is thought that this reactive oxygen will also be captured by the present niobium-titanium layer.

Further, when a glass sheet carrying a film stack of the invention is raised to a high temperature (e.g., on the order of about 700 degrees C.), the color of the film stack will be largely unaffected, with any slight color change being a result of partial oxidizing and/or nitriding of the niobium-titanium. Thus, the present niobium-titanium layer is particularly advantageous when incorporated into a low-emissivity coating that is to be tempered or otherwise heat treated. For example, low-emissivity coatings provided with the present niobium-titanium layers should exhibit less color shift when subjected to elevated temperatures than equivalent coatings having titanium protective layers. Further, low-emissivity coatings provided with the present niobium-titanium layers should exhibit greater abrasion resistance than equivalent coatings having niobium protective layers. Finally, the cost of the present niobium-titanium layer would be less than the cost of a niobium protective layer. Thus, the niobium-titanium layer could be incorporated into a low-emissivity coating at a cost that is affordable to consumers.

In the embodiment of FIG. 1, a protective niobium-titanium layer 80 is formed upon an infrared-reflective film 50. Typically, the protective niobium-titanium layer is deposited as a metallic film. For example, metallic niobium and metallic titanium may be sputtered onto the infrared-reflective film 50 in an inert atmosphere (e.g., argon). In many cases, the thus coated substrate is then conveyed into a subsequent oxygen-containing sputtering zone (e.g., where a subsequent transparent oxide film is deposited upon the niobium-titanium layer). As a result of this exposure, the metallic niobium-titanium layer will typically become at least partially oxidized (e.g., an outer portion of this layer will become oxidized, while an inner portion remains metallic).

It is to be understood that the term "niobium-titanium" is used herein to refer to any compound that includes at least some niobium and at least some titanium. For example, included in this definition is any alloy or mixture comprising both niobium and titanium, whether metallic or in the form of an oxide, nitride, etc., and optionally including one or more other desired materials. In one embodiment, the niobium-titanium is essentially free of metals and semi metals (i.e., metalloids) other than niobium and titanium. For example, the niobium-titanium may consist essentially of metallic niobium and titanium and/or reaction products (e.g., oxides, nitrides, etc.) thereof. In particular, the niobium-titanium may consist essentially of niobium, titanium, and oxygen and/or nitrogen.

The inventors have discovered that using niobium in the protective layers of low-emissivity coatings tends to provide desirable resistance in such coatings to color shifting during exposure to elevated temperatures. The inventors have also discovered that using titanium in the protective layers of low-emissivity coatings tends to provide desirable abrasion resistance in such coatings. Thus, the present low-emissivity coatings are provided with protective layers comprising both niobium and titanium to achieve abrasion resistance as well as resistance to color shifting during elevated temperature processing.

The percentages of niobium and titanium in the protective layer can be varied as desired. Optimally, the percentages of niobium and titanium are selected to achieve a niobium-titanium layer having desired levels of abrasion resistance and resistance to color shifting during exposure to elevated temperatures (e.g., temperatures on the order of about 700° C., or 1112° F., as in glass tempering). Greater percentages of niobium should yield greater resistance to color shifting, while greater percentages of titanium should yield greater abrasion resistance. Thus, in cases where abrasion resistance is a particular concern, the protective layer preferably comprises a greater percentage of titanium than niobium. In other cases, where resistance to color shifting is a particular concern, the protective layer preferably comprises a greater percentage of niobium than titanium. If an even tradeoff between abrasion resistance and resistance to color shifting is desired, then substantially equal percentages of niobium and titanium should be used. In one embodiment, the niobium-titanium layer comprises about 45% niobium and about 55% titanium.

The protective niobium-titanium layer is deposited at a thickness that is small enough that visible transmissivity is not unduly reduced by the presence of this layer. To satisfy this goal, a deposition thickness of up to about 30 angstroms should be suitable. The protective niobium-titanium layer is also deposited at a thickness that is sufficient to protect the neighboring (e.g., underlying or overlying) infrared-reflective film during tempering. In this regard, the protective layer is preferably deposited at a thickness of about 10–30 Å, more preferably about 15–22 Å, and perhaps optimally about 20 Å. As noted above, the protective layer may be deposited as a thin layer comprising (optionally comprising a major portion of) metallic niobium-titanium. The majority of the metal may then be converted to an oxide and/or nitride of varying stoichiometry during deposition of subsequent layers of the film stack and/or during subsequent heat treatment (e.g., tempering). As a result of this oxidizing and/or nitriding, the protective niobium-titanium layer will typically increase in thickness. Thus, the ultimate thickness of the niobium-titanium layer may be greater than the preferred deposition thicknesses listed above. It may be feasible to use deposition thicknesses slightly below 10 Å (e.g., about 7 Å).

In one embodiment, the thickness of the protective niobium-titanium layer is selected such that following a desired heat treatment (e.g., tempering) and the associated conversion of some of the niobium and titanium into their respective oxides and/or nitrides, there remains a portion (e.g., the innermost portion) of the niobium-titanium layer that is neither significantly oxidized nor significantly nitrided. This unreacted portion may be essentially non-oxidized and essentially non-nitrided. The protective layer thickness is optimally selected such that this unreacted portion remains essentially metallic. The unreacted portion will typically be that portion of the niobium-titanium layer that is contiguous to a directly underlying infrared-reflective film.

With continued reference to the embodiment of FIG. 1, the niobium-titanium layer 80 is positioned over the outer face (i.e., the face oriented away from the substrate) of the infrared-reflective film 50. Preferably, this niobium-titanium layer 80 is positioned directly over, and is in direct contact with, the underlying infrared-reflective film 50. While this will typically be preferred, other useful embodiments employ a protective niobium-titanium layer positioned over, but separated by one or more films of other material from, an underlying infrared-reflective film.

It is expected to be particularly desirable to position a protective niobium-titanium layer over an infrared-reflective film. However, this is by no means a requirement. For example, in an alternate embodiment (not shown), a protective niobium-titanium layer is positioned beneath, but not above, an infrared-reflective film in a "single" type low-emissivity coating. In cases where silver is used as the infrared-reflective film, it may be desirable to not position the niobium-titanium layer directly beneath this film. For example, it is advantageous to provide a layer of zinc oxide directly beneath each silver film in a low-emissivity coating, as this has been found to promote the growth of a high quality silver film. However, positioning a niobium-titanium layer directly beneath an infrared-reflective film, even one formed of silver, is a feasible option, and embodiments of this nature may be desirable for certain applications.

Figure 2:
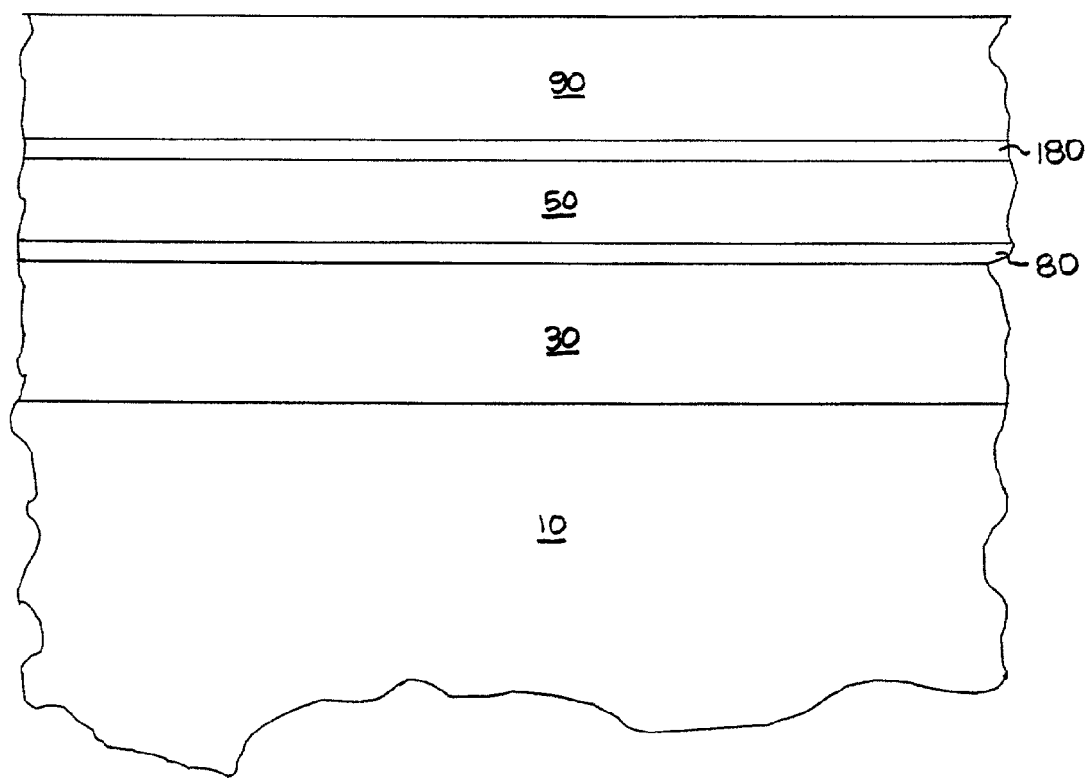
FIG. 2 is a schematic, cross-sectional view of a substrate carrying a film stack in accordance with another embodiment of the invention.

FIG. 2 illustrates an embodiment of the invention wherein two protective niobium-titanium layers 80, 180 are positioned respectively beneath and over the infrared-reflective film 50 in a "single" type low-emissivity coating. In this embodiment, the infrared-reflective film 50 is sandwiched between the niobium-titanium layers 80, 180. The niobium-titanium layer 80 beneath the infrared-reflective film 50 is advantageously several angstroms thinner than the niobium-titanium layer 180 over the infrared-reflective film 50. This may prevent undue reduction in transmissivity, as the niobium-titanium layers 80, 180 are preferably provided only at the thicknesses required to protect the infrared-reflective film 50. As connoted above, when silver is used in the infrared-reflective film 50, it may be advantageous not to position the inner niobium-titanium layer 80 directly beneath this film 50, since a directly underlying zinc oxide film tends to optimize silver growth. However, sandwiching an infrared-reflective film 50, even one formed of silver, directly between two niobium-titanium layers 80, 180 (and hence positioning the first niobium-titanium layer 80 directly beneath the infrared-reflective layer 50) may provide a desirable level of protection for the infrared-reflective film 50. Therefore, the embodiment of FIG. 2 may be preferred for certain applications.

One aspect of the invention provides methods of depositing a niobium-titanium layer having abrasion resistance and having resistance to color shifting during exposure to elevated temperatures. The niobium-titanium layer can be deposited advantageously by sputter deposition (i.e., sputtering). Sputtering techniques and equipment are well known in the present art. For example, magnetron sputtering chambers and related equipment are available commercially from a variety of sources (e.g., Leybold and BOC Coating Technology). Useful magnetron sputtering techniques and equipment are also disclosed in U.S. Pat. No. 4,166,018, issued to Chapin, the entire teachings of which are incorporated herein by reference.

Figure 10:
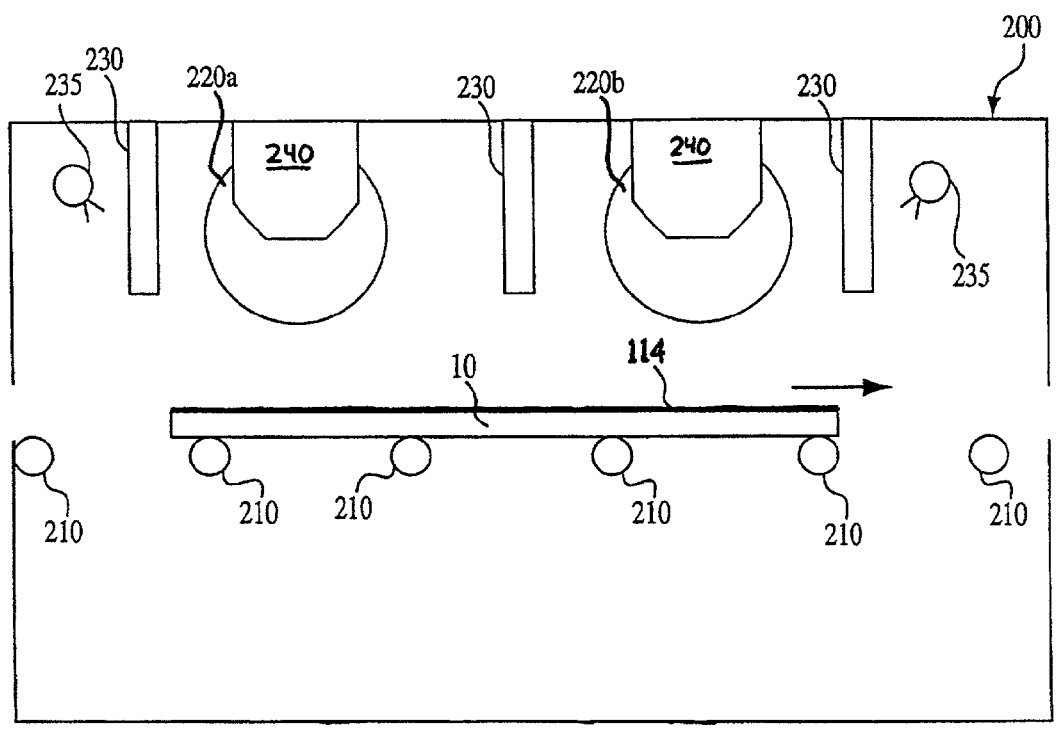
FIG. 10 is a schematic end view of a sputtering chamber that has utility in certain methods of the invention.

Thus, conventional magnetron sputtering techniques and equipment can be used to deposit the present niobium-titanium layer. Techniques and equipment of this nature are best understood with reference to FIG. 10, wherein there is illustrated a sputtering chamber 200 equipped with two cathodes. Each cathode includes a sputtering target 220a, 220b, end blocks 240, and a magnet array (not shown) and cooling lines (not shown) within the target. While the illustrated chamber 200 is provided with two cathodes, it may be desirable to employ a single cathode instead. Also shown in FIG. 10 are anodes 230, gas distribution pipes 235, and transport rollers 210 for conveying the substrate 10 through the chamber 200. Sputtering equipment of this nature is well known in the present art.

The sputtering targets 220a, 220b illustrated in FIG. 10 are depicted as being cylindrical magnetron targets (i.e., C-Mags). However, any type of sputtering target (e.g., planar or cylindrical) can be used. For example, the sputtering chamber can alternatively be provided with a single planar target. The selection of appropriate planar and/or cylindrical targets will be well within the purview of those skilled artisans.

In one method of the invention, a niobium-titanium layer is deposited by sputtering one or more targets carrying target material comprising an alloy or mixture of niobium and titanium. For example, the target material may comprise about 45% metallic niobium and about 55% metallic titanium. The percentages of niobium and titanium in the target material can be varied as desired. Optimally, the percentages of niobium and titanium in the target material are selected to achieve a niobium-titanium layer having desired levels of abrasion resistance and resistance to color shifting during elevated temperature processing. When abrasion resistance is a primary concern, the targets preferably comprise a greater percentage of titanium than niobium. On the other hand, when resistance to color shifting is a primary concern, the targets preferably comprise a greater percentage of niobium than titanium. While the target material may consist (or consist essentially) of niobium and titanium, it is anticipated that the target material may include one or more other materials in addition to niobium and titanium. Niobium-titanium targets are commercially available from Wah Chang, which is located in Albany, Oreg., U.S.A.

In another method of the invention, niobium-titanium film is deposited by co-sputtering. Co-sputtering is a process in which two or more targets of different composition are sputtered simultaneously (or at substantially the same time). The niobium-titanium layer can be deposited by co-sputtering a niobium-containing target and a titanium-containing target in the same sputtering chamber or zone. Thus, one of the targets 220a, 220b in the illustrated chamber 200 may be a niobium-containing target and the other may be a titanium-containing target. For example, the targets 220a, 220b may be formed respectively of metallic niobium and metallic titanium. Alternatively, the targets 220a, 220b may be formed respectively of a niobium compound and a titanium compound. Niobium targets and niobium compound targets, as well as titanium targets and titanium compound targets, are available from a number of commercial suppliers, such as TICO Titanium Inc., New Hudson, Mich., U.S.A. The term "niobium-containing" is used herein to refer respectively to any material that contains at least some niobium. The terms "titanium-containing", "silver-containing", etc. are likewise used herein.

Thus, the present co-sputtering method comprises providing a niobium-containing target and a titanium-containing target. Both targets are positioned in a sputtering chamber having a sputtering cavity in which a controlled environment can be established. One or more power supplies are provided for delivering electric charge (e.g., cathodic charge) to both targets. The cathodes are then energized to sputter niobium and titanium onto a substrate, thereby depositing the niobium-titanium layer upon a surface (e.g., a major surface oriented toward the targets) of the substrate or upon a film layer previously deposited upon the substrate (e.g., onto a previously deposited infrared-reflective layer, beneath which may be other previously deposited films, as described herein). The niobium-containing target and the titanium-containing target may be sputtered at substantially the same time (e.g., simultaneously or in succession). A first power level is selected for delivery of electric charge to the niobium-containing target and a second power level is selected for delivery of electric charge to the titanium-containing target. These power levels are selected to deposit desired percentages of niobium and titanium. Optimally, the desired percentages of niobium and titanium are selected to achieve in the deposited niobium-titanium layer desired levels of abrasion resistance and resistance to color shifting during exposure to elevated temperatures. If so desired, the first and second power levels may be substantially the same. Alternatively, the first power level may be greater than the second power level. For example, this would generally be preferred in cases where resistance to color shifting is a primary concern. On the other, the second power level may be greater than the first power level. This would generally be preferred in cases where abrasion resistance is a primary concern.

Thus, preferred methods of the invention involve depositing the protective niobium-titanium layer by sputtering, whether conventionally or by co-sputtering. With continued reference to FIG. 10, there is provided a substrate 10 carrying a partial coating 114 that includes at least one infrared-reflective film. The infrared-reflective film will typically be carried over a transparent dielectric film, and in most cases will define the outermost face of the an partial coating 114 (prior to deposition thereon of the niobium-titanium layer). As will be obvious to those skilled in the art, one or more other films may be formed between the substrate and the transparent dielectric film and/or between the transparent dielectric film and the infrared-reflective film. For example the partial coating 114 may take the form of the film stack portion beneath, and including, any one of the infrared-reflective films 50, 150 depicted in FIGS. 1–9. In one particular method, the partial coating 114 includes an exposed outermost infrared-reflective silver or silver-containing film that is carried directly over a transparent dielectric film (e.g., zinc oxide).

The partially coated substrate 10 is positioned beneath one or more targets 220a, 220b, which comprise both niobium and titanium (either collectively or individually, depending on whether conventional sputtering or co-sputtering is used). As depicted in FIG. 10, the substrate 10 can be positioned upon a plurality of transport rollers 210. The target or targets are sputtered (i.e., energized) to deposit a niobium-titanium film upon the partially-coated substrate (in most cases, directly upon the exposed infrared-reflective film). During sputtering, the substrate 10 can be conveyed through the chamber 200 (e.g., continuously and at constant speed). It is well known to drive (i.e., rotate) one or more of the rollers 210 to convey the substrate 10 through the chamber 200 (e.g., in the direction of the arrow shown in FIG. 10).

It will typically be preferred to sputter the niobium-titanium target or targets in a non-reactive (i.e., inert) atmosphere to deposit the protective niobium-titanium layer. This would be expected to yield a protective niobium-titanium layer that is as reactive as possible, thus enabling it to capture a great deal of oxygen and/or nitrogen during deposition of subsequent films and/or during heat treatment. In this regard, a sputtering atmosphere consisting essentially of noble gas (e.g., about 100% argon) may be preferred. For example, argon at a pressure of about $3 \times 10^{-3}$ mbar should give good results. Power levels of up to about 10 kW per target are preferred for sputter depositing the niobium-titanium film. Care should be taken to prevent accidental leakage (flow of reactive gases) into the area where the niobium-titanium layer is sputtered under control. Any leak near the targets (at low power levels) could create local areas of oxidation in the niobium-titanium layer. This could create uniformity problems before and after tempering. The substrate 10 upon which the niobium-titanium layer is deposited can be conveyed through the sputtering chamber 200 at essentially any desired speed. For example, substrate speeds of between about 100–500 inches per minute should be suitable.

While sputtering techniques are presently contemplated to be preferred for depositing the protective niobium-titanium layer, any desired thin film deposition technique can be employed. For example, another useful method for depositing the present niobium-titanium layer involves plasma chemical vapor deposition (i.e., C.V.D.). Reference is made to U.S. Pat. No. 4,619,729 (Johncock et al.), U.S. Pat. No. 4,737,379 (Hudgens et al.), and U.S. Pat. No. 5,288,527 (Jousse et al.), the entire teachings of each of which are incorporated herein by reference. Plasma C.V.D. involves decomposition of gaseous sources via a plasma and subsequent film formation onto solid surfaces, such as glass substrates. The thickness of the resulting film can be adjusted by varying the speed of the substrate as it passes through a plasma zone and by varying the power and gas flow rate within each zone. Those skilled in the art would be able to select other suitable deposition methods for applying the present niobium-titanium layer.

With continued reference to the embodiment of FIG. 1, an antireflective inner layer 30 is formed upon one of the two major surfaces of the substrate 10. The antireflective inner layer 30 includes one or more transparent dielectric films. It is to be understood that the term "transparent dielectric" is used herein to refer to any non-metallic (i.e., neither a pure metal nor a metal alloy) compound that includes any one or more metals and is substantially transparent when deposited as a thin film. For example, included in this definition would be any metal oxide, metal nitride, metal carbide, metal sulfide, metal boride, and any combinations thereof (e.g., an oxynitride). Further, the term "metal" should be understood to include all metals and semi-metals (i.e., metalloids).

The antireflective inner layer 30 preferably has an overall thickness of between about 85 Å and about 700 Å, and more preferably between about 100 Å and about 250 Å. This layer 30 may comprise one or more transparent dielectric materials. For example, a wide variety of metal oxides may be used, including oxides of zinc, tin, indium, bismuth, titanium, hafnium, zirconium, and alloys and mixtures thereof. While metal oxides are generally preferred due to their ease and low cost of application, metal nitrides (e.g., silicon nitride) can also be used quite advantageously. Those skilled in the present art would be able to readily select other materials that could be used for this layer 30.

The inner layer 30 in the embodiment of FIG. 1 is depicted as being a single film. However, this layer 30 can be replaced with a plurality of films, if so desired. For example, the inner layer 30 may include two separate films, optionally formed of different transparent dielectric materials. If this layer 30 consists of a single film, then such film is preferably formed of zinc oxide. For example, in one embodiment, this layer 30 comprises zinc oxide applied at a thickness of about 100 Å. Whether the inner layer 30 consists of one film or multiple films, it may be optimal to limit each individual film to a physical thickness of less than about 250 Å, or to an optical thickness of no more than about 450 Å, for reasons discussed below.

As has been described, the composition of the antireflective inner layer 30 can be varied as desired. However, it is generally preferred that at least a thin film of zinc oxide be applied as the outermost portion (i.e., the portion farthest away from the substrate) of this layer 30. As noted above, this is believed to enhance the quality of the film stack, at least if the overlying infrared-reflective layer 50 is formed of silver, as zinc oxide has been found to provide a good foundation for the nucleation of silver. Thus, it is preferable either to form the whole of the antireflective inner layer 30 of zinc oxide or to replace this layer 30 with two or more films (not shown), wherein the outermost film is zinc oxide.

Thus, it is contemplated that the antireflective inner layer 30 will be replaced with two or more films in certain embodiments (not shown). A variety of film stacks are known to be suitable for use as the antireflective inner region of a "single" type low-emissivity coating. For example, the first film (i.e., the film nearest the substrate) may be an alloy or mixture of zinc oxide, such as an alloy or mixture of zinc oxide and bismuth oxide, tin oxide, or indium oxide. As noted above, the second film is preferably an oxide of zinc alone, at least if the overlying infrared-reflective film 50 is formed of silver. While the relative thicknesses of these two films can be varied as desired, the combined thickness of both films is preferably between about 85 angstroms and about 700 angstroms. Those skilled in the art would be able to readily select a variety of other suitable film stacks to use as this antireflective inner layer 30.

In the embodiment of FIG. 1, the second illustrated film 50 is the infrared-reflective layer, and the third illustrated film 80 is the protective niobium-titanium layer. Both of these layers 50, 80 are described above in detail. An outer film region 90 is desirably positioned over the niobium-titanium layer 80. In its simplest form, the outer film region 90 consists of a single transparent dielectric layer applied at a thickness of between about 85 Å and about 700 Å. Useful materials for this layer include silicon nitride and oxides of zinc, tin, indium, bismuth, titanium, hafnium, zirconium, and alloys and mixtures thereof. Skilled artisans would be able to select other suitable materials and thicknesses for the outer layer of a low-emissivity coating.

If so desired, the outer film region 90 can be formed of a plurality of separate films. A variety of film stacks are known to be suitable for use as the outer film region of a "single" type low-emissivity coating. In one particularly preferred embodiment (not shown), the outer film region 90 is formed of the following six layers: (1) zinc oxide applied at a thickness of about 38 Å directly upon the protective layer 80; (2) silicon nitride applied at a thickness of about 45 Å directly upon the preceding zinc oxide layer; (3) zinc oxide applied at a thickness of about 30–42 Å directly upon the preceding silicon nitride layer; (4) silicon nitride applied at a thickness of about 50 Å directly upon the preceding zinc oxide layer; (5) zinc oxide applied at a thickness of about 156 Å directly upon the preceding silicon nitride layer; and (6) silicon nitride applied at a thickness of about 65–75 Å directly upon the preceding zinc oxide layer. In this embodiment, it is anticipated that the thickness of any given layer can be varied by as much as about 15% while still achieving good results. Whether the outer film region 90 consists of one film or multiple films, it may be optimal to limit each individual film to a physical thickness of less than about 250 Å, or to an optical thickness of no more than about 450 Å, for reasons discussed below.

As noted above, low-emissivity coatings with at least one protective niobium-titanium layer are particularly advantageous. The niobium-titanium layer is provided to impart both scratch resistance and resistance to the color shift that can occur during tempering and other heat treatment. In certain embodiments, there is provided a low-emissivity coating that includes at least one protective niobium-titanium layer and an outer (i.e., further from the substrate than the outermost infrared-reflective film) titanium nitride film. In these embodiments, the titanium nitride film can be incorporated into, or applied over, the outer film region 90, 130 of the coating. These embodiments may involve "single" or "double" type low-emissivity coatings, as well as low-emissivity coatings having three or more infrared-reflective films.

In another preferred embodiment, there is provided a low-emissivity coating that includes at least one protective niobium-titanium layer and at least one chemically-durable outer film. The chemically-durable film imparts increased chemical stability in the coating. For example, the chemically-durable film can be formed of silicon nitride or the like. Particularly desirable silicon nitride films are disclosed in U.S. Pat. No. 5,834,103, issued to Bond et al., the entire teachings of which are incorporated herein by reference. In the present embodiment, the chemically-durable film can be incorporated into, or applied over, the outer film region 90, 130 of the coating. Low-emissivity coatings with this combination of features should have desirable chemical stability, desirable scratch resistance, and should exhibit very little color shift during tempering or other heat treatment (even when subjected to temperatures on the order of about 700 degrees C.). This embodiment may involve a "single" or "double" type low-emissivity coating, or a low-emissivity coating having three or more infrared-reflective films.

In certain particularly preferred embodiments, there is provided a low-emissivity coating that includes at least one protective niobium-titanium layer, at least one outer titanium nitride film, and at least one chemically-durable outer film. In embodiments of this nature, the titanium nitride film and the chemically-durable film can both be incorporated into, or applied over, the outer film region 90, 130 of the coating. For example, a sandwich of silicon nitride, titanium nitride, and silicon nitride films can be advantageously incorporated into, or applied over, the outer film region 90, 130 of the coating. Low-emissivity coatings with this combination of features should have desirable scratch resistance, desirable chemical stability, and should exhibit very little color shift during tempering or other heat treatment (even when subjected to temperatures on the order of about 700 degrees C.). It will be appreciated that these embodiments may involve "single" or "double" type low-emissivity coating, or low-emissivity coatings having three or more infrared-reflective films.

Figure 3:
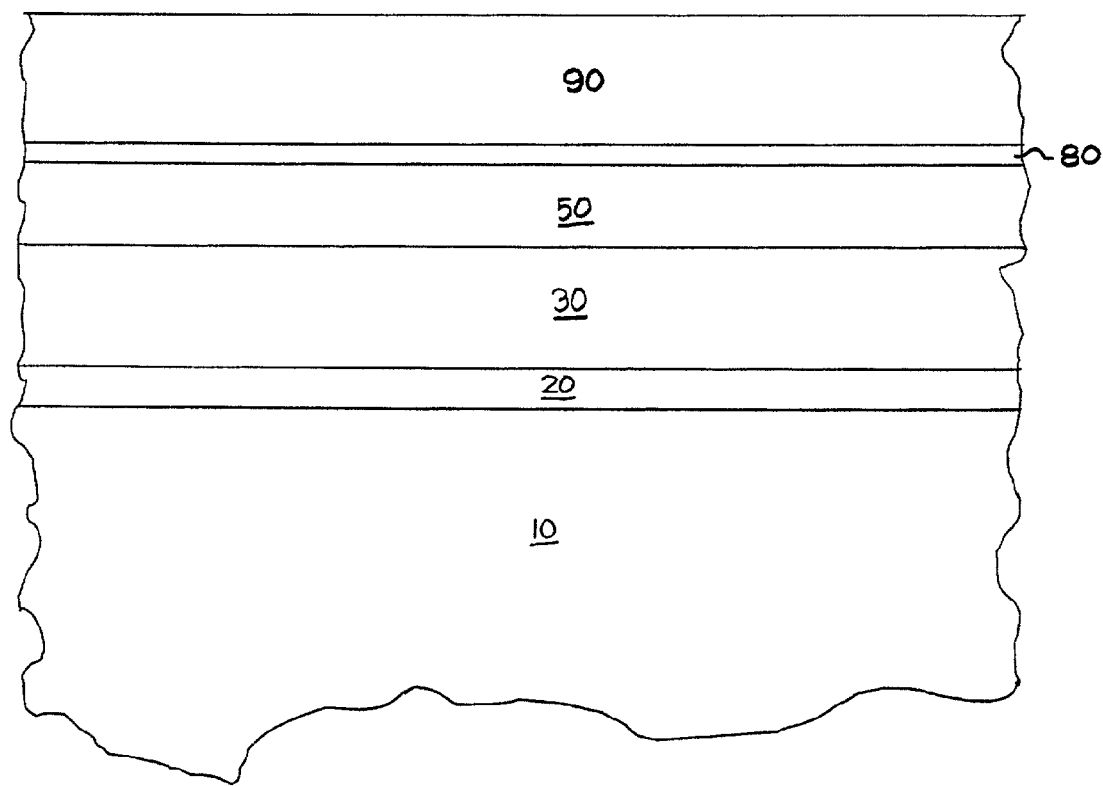
FIG. 3 is a schematic, cross sectional view of a substrate carrying a film stack in accordance with still another embodiment of the invention.

FIG. 3 illustrates an embodiment of the present invention that is especially preferred. In this embodiment, the layer structure of the coating is like that shown in FIG. 1, except that a transparent base layer 20 is positioned between the substrate 10 and the antireflective layer 30. This base layer 20 is provided to minimize problems associated with corroded substrates. As described in U.S. patent application Ser. No. 10/087,662, entitled "Thin Film Coating Having Transparent Base Layer", the entire teachings of which are incorporated herein by reference, certain transparent base layers 20 have been found to significantly reduce the formation of haze that has otherwise been observed when moisture-corroded glass is used with a temperable low-emissivity coating.

The transparent base layer 20 can be advantageously formed of silicon dioxide or another amorphous (or substantially amorphous) film having an index of refraction that is equal to, or substantially the same as, that of the substrate 10 to which it is applied. Since the refractive index of the transparent base layer is approximately the same as that of the substrate, the base layer 20 can be incorporated on the substrate at essentially any thickness without substantially changing the visible transmission, reflection, or color of the coated substrate. As a consequence, the transparent base layer 20 has no strict maximum thickness.

However, it is time, cost, and resource effective to minimize the thickness of the transparent base layer 20. This is especially true in cases where the base layer 20 is formed of sputtered silicon dioxide, due to the relatively slow sputter rate of silicon dioxide. For example, it is preferable to occupy as few deposition zones as possible in depositing the base layer 20. This is particularly important when the overlying film stack is complex (e.g., when the inner region 30, intermediate region 190, or outer region 90, 130 includes multiple films), as the desired number of films in the stack may otherwise require more deposition zones than are available. Further, the stress in the base layer 20 will typically increase as the thickness of this layer 20 is increased. While this may be less important when the base layer 20 is formed of sputtered silicon dioxide (since sputtered silicon dioxide tends not to have high stress), some advantage in the way of low stress may be gained by minimizing thickness. Good results are expected for transparent base layers 20 having a thickness of less than 100 angstroms, and even for those having a thickness of less than about 90 angstroms (e.g., about 70 angstroms). Base layers 20 of silicon dioxide, for example, are expected to give good results at these thicknesses.

The transparent base layer 20 preferably has a minimum thickness of at least about 50 angstroms. A thickness of this magnitude is preferred to significantly reduce problems (e.g., haze formation during tempering) associated with substrate defects (e.g., moisture corrosion). For example, the transparent base layer 20 may have a thickness of between about 50 angstroms and about 90 angstroms. Preferably, the base layer 20 is formed directly upon the substrate 10.

As noted above, the embodiment of FIG. 3 is anticipated to be particularly desirable. This embodiment provides a low-emissivity coating with a combination of at least one protective niobium-titanium layer 80 and the described transparent base layer 20. Low-emissivity coatings with this combination of features are expected to exhibit very little noticeable color shift and minimal haze formation during tempering or other heat treatment (even when subjected to temperatures on the order of about 700 degrees C.). Thus, these coatings are expected to be particularly well suited for use on substrates that are to be tempered or otherwise heat treated. Coatings of this nature are expected to have desirable scratch resistance as well.

Figure 4:
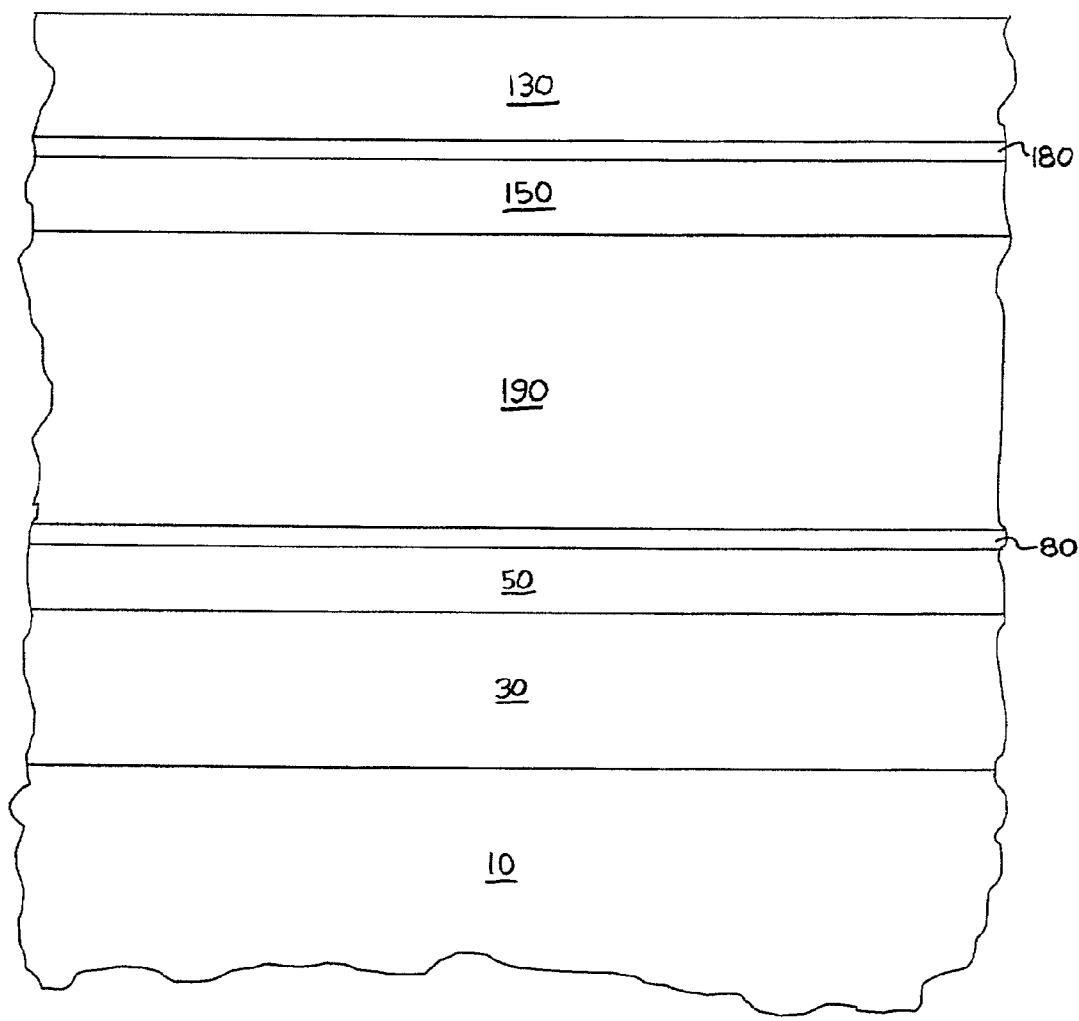
FIG. 4 is a schematic, cross sectional view of a substrate carrying a film stack in accordance with yet another embodiment of the invention.

FIG. 4 depicts another preferred embodiment of the invention. The illustrated embodiment involves a low-emissivity film stack with two infrared-reflective layers 50, 150. In the illustrated film stack, an antireflective inner layer 30 is formed upon the substrate. Preferably, this inner layer 30 has an overall thickness of between about 100 Å and about 400 Å, and more preferably between about 100 Å and about 275 Å. As with the antireflective inner layer 30 described above with reference to FIG. 1, the inner layer 30 in the present embodiment may include one or more transparent dielectric films. For example, this layer 30 may advantageously comprise a metal nitride (e.g., silicon nitride) and/or a metal oxide, such as oxides of zinc, tin, indium, bismuth, titanium, hafnium, zirconium, and alloys and mixtures thereof. Skilled artisans would be able to select other materials that could be used for the antireflective inner layer 30 in this embodiment.

The inner layer 30 in the embodiment of FIG. 4 is depicted as being a single film. However, this layer 30 can be replaced with a plurality of separate films, if so desired. For example, this layer 30 may include two separate films, optionally formed of different transparent dielectric materials. If the inner layer 30 in this embodiment consists of a single film, then such film is preferably formed of zinc oxide. For example, this layer 30 may be single film of zinc oxide applied at a thickness of about 230 Å. Whether the inner layer 30 in this embodiment consists of one film or multiple films, it may be optimal to limit each individual film to a physical thickness of less than about 250 Å, or to an optical thickness of no more than about 450 Å, for reasons discussed below.

As has been described, the composition of the antireflective inner layer 30 in the embodiment of FIG. 4 can be varied as desired. However, it is generally preferred that at least a thin film of zinc oxide be applied as the outermost portion (i.e., the portion farthest away from the substrate) of this layer 30. This is believed to enhance the quality of the film stack, at least if the overlying infrared-reflective film 50 is formed of silver, as zinc oxide is thought to provide a good foundation for the nucleation of silver. Thus, it is preferable to either form the whole of the antireflective inner layer 30 of zinc oxide or to replace this layer 30 with two or more films (not shown), wherein the outermost film is zinc oxide.

Thus, it is contemplated that the inner layer 30 in the embodiment of FIG. 4 will be replaced with two or more films (not shown) in some cases. A variety of film stacks are known to be suitable for use as the antireflective inner region of a "double" type low-emissivity coating. For example, the first film (i.e., the film nearest the substrate) may be an alloy or mixture of zinc oxide, such as an alloy or mixture of zinc oxide and bismuth oxide, tin oxide, or indium oxide. As connoted above, the second film is preferably an oxide of zinc alone, at least if the overlying infrared-reflective film 50 is formed of silver. One suitable embodiment of this nature involves a first film having a thickness of between about 60 angstroms and about 100 angstroms, perhaps optimally about 90 angstroms, and a second film having a thickness of between about 35 angstroms and about 62 angstroms, perhaps optimally about 40 angstroms.

The second layer 50 illustrated in FIG. 4 is an infrared-reflective film. The infrared-reflective materials described above with reference to FIG. 1 can also be used for the infrared-reflective layers 50, 150 in the embodiment of FIG. 4. In most cases, it will be preferable to employ silver or silver-containing layers 50, 150. In a particularly preferred embodiment, the first infrared-reflective layer 50 comprises silver at a thickness of between about 50 Å and about 150 Å, more preferably between about 58 Å and about 90 Å, and perhaps optimally about 80 Å.

A protective niobium-titanium layer 80 can be provided advantageously over the first infrared-reflective layer 50. The niobium-titanium layers 80, 180 illustrated in FIG. 4 are of the nature described above. For example, the first niobium-titanium layer 80 is preferably applied directly upon the first infrared-reflective layer 50. Further, the thickness of the first niobium-titanium layer 80 is preferably between about 7–30 Å, more preferably between about 15–22 Å, and perhaps optimally about 20 Å.

With continued reference to FIG. 4, an intermediate film region 190 is positioned outwardly from (i.e., further from the substrate than) the first infrared-reflective layer 50 (e.g., upon the protective layer 80, if present). In its simplest form, this intermediate film region 190 consists of a single layer of any desired transparent dielectric material. For example, a single transparent dielectric film (e.g., zinc oxide) having a thickness of about 400–1200 Å can be used.

Alternatively, two or more separate transparent dielectric films can be positioned between the infrared-reflective layers 50, 150. These films preferably have a combined thickness of about 400–1200 Å. In certain embodiments of this nature, the intermediate film region 190 includes at least one metal oxide film and at least one metal nitride film. The present niobium-titanium layer 80 may be particularly advantageous in such embodiments. For example, the intermediate film region 190 may include a silicon nitride film (or another substantially amorphous film) and a zinc oxide film, with the zinc oxide film being positioned over (i.e., outwardly from) the silicon nitride film. In more detail, the silicon nitride film may have a thickness of about 500 angstroms and the zinc oxide film may have a thickness of about 40 angstroms.

Thus, in one embodiment of the invention, there is provided a low-emissivity coating having at least two infrared-reflective films wherein the innermost infrared-reflective film is directly followed, moving outwardly, by a contiguous sequence of a protective niobium-titanium layer, a nitride film (e.g., silicon nitride), and a metal oxide film (e.g., zinc oxide). If so desired, one or more additional films can be provided between the metal oxide film and the second infrared-reflective film. In another embodiment, there is provided a low-emissivity coating having at least two infrared-reflective films wherein the innermost infrared-reflective film is directly followed, moving outwardly, by a contiguous sequence of a protective niobium-titanium layer, a metal oxide layer (e.g., zinc oxide), and a nitride layer (e.g., silicon nitride). In this embodiment, one or more additional films can optionally be provided between the metal oxide film and the second infrared-reflective film.

It is preferable to form the intermediate film region 190 of a plurality of discrete layers. Low-emissivity coatings having an intermediate film region 190 formed of discrete multiple layers are believed to exhibit minimal haze formation during tempering. This is discussed in International Application Number PCT/US00/42434, entitled "Haze Resistant Transparent Film Stacks", the entire teachings of which are incorporated herein by reference. As described in this International Application, it is preferable to limit each layer of the intermediate film region 190 to a physical thickness of no more than about 250 Å, or more preferably to no more than about 225 Å, or to an optical thickness of no more than about 450 Å. Moreover, it is believed to be advantageous if each layer in the intermediate film region 190 is formed of a different material than each layer contiguous thereto. This is believed to reduce the likelihood that objectionable haze will develop in the film stack during heat treatment.

In one embodiment, the intermediate film region includes at least one amorphous or substantially amorphous material (e.g., silicon nitride). Materials of this nature are advantageous in that they tend not to experience major crystal growth when tempered or otherwise heat treated. As a consequence, they tend not to develop objectionable haze during heat treatment. One preferred embodiment includes an intermediate film region comprising silicon nitride. Preferably, this silicon nitride is broken up into two or more discrete silicon nitride films, separated from one another by film of a material other than silicon nitride. This is believed to be advantageous, since silicon nitride tends to have significant stress, and since this stress may become more problematic as the thickness of the silicon nitride is increased. Thus, it may be desirable to provide an intermediate film region that comprises a plurality of discrete silicon nitride films each having an individual thickness of less than about 250 angstroms, more preferably less than about 225 angstroms, or perhaps optimally less than 200 angstroms. These silicon nitride films may be separated, for example, by one or more oxide layers, like zinc oxide. In one embodiment, there is provided a double-type low-emissivity coating wherein each of the intermediate films has a physical thickness of less than 200 angstroms. In this embodiment, it is preferable if at least one of the intermediate films is silicon nitride or another film that is amorphous (or substantially amorphous).

The number of layers in the intermediate region 190 can be varied as desired. However, it is believed to be preferable to form this region 190 of at least three separate layers. In certain embodiments, the intermediate film region includes a silicon nitride film positioned between two zinc oxide films. For example, one embodiment (not shown) provides an intermediate film region 190 comprising, moving outwardly: (1) zinc oxide at a thickness of about 150–250 Å, perhaps optimally about 220 Å; (2) silicon nitride at a thickness of about 40–120 Å, perhaps optimally about 80–100 Å; and (3) zinc oxide at a thickness of about 150–250 Å, perhaps optimally about 210 Å. It is believed to be even more preferable to form the intermediate film region 190 of at least five separate layers, as will now be discussed.

Figure 5:
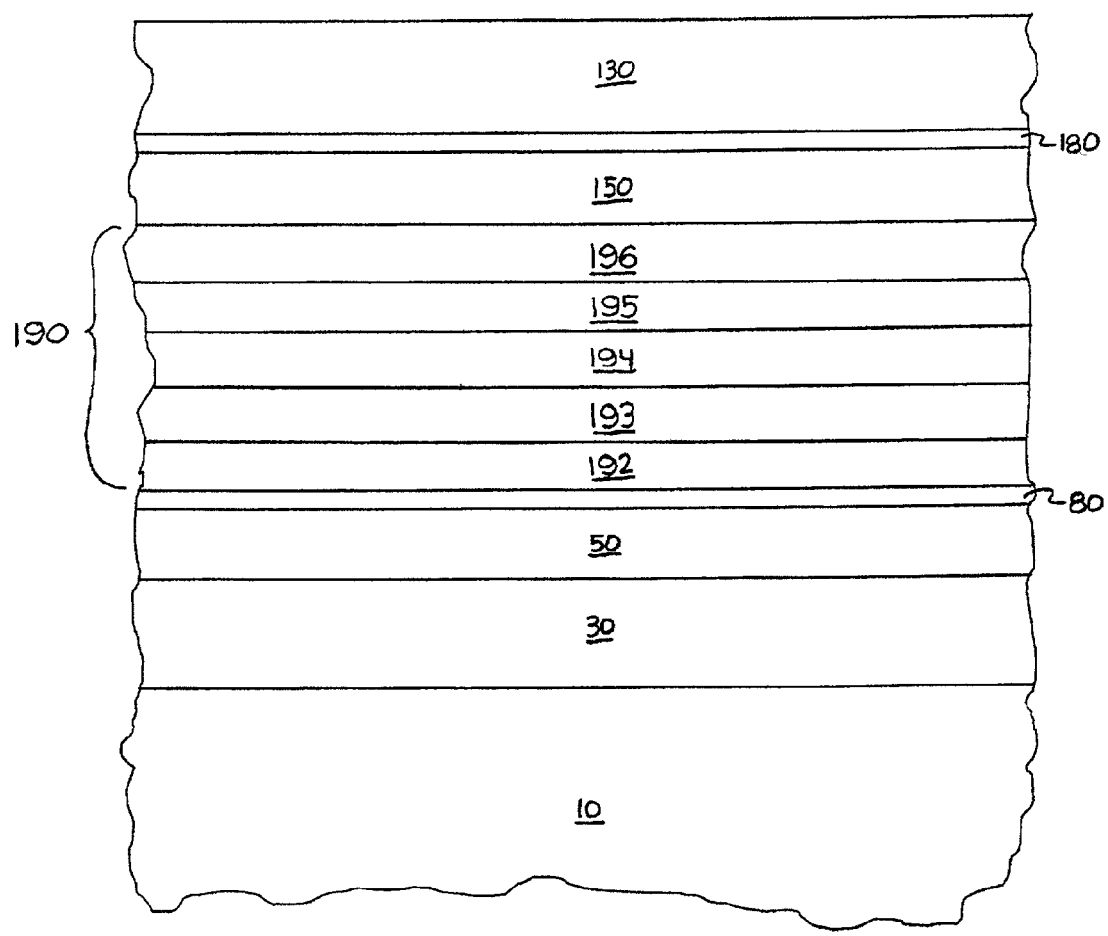
FIG. 5 is a schematic, cross sectional view of a substrate carrying a film stack in accordance with a further embodiment of the invention.

FIG. 5 illustrates an embodiment wherein the intermediate film region 190 includes five separate layers. Specifically, the intermediate film region 190 in this embodiment includes a first layer 192, a second layer 193, a third layer 194, a fourth layer 195, and a fifth layer 196. In some cases, these layers 192–196 are provided in the form of alternating zinc oxide and silicon nitride films (e.g., three zinc oxide films 192, 194, 196 and two silicon nitride films 193, 195). Intermediate films of this nature are particularly preferred.

As described in the above-noted International Application, it may be preferable to form the intermediate film region 190 of an odd number of intermediate layers such that the bottom and top layers of this region 190 comprise the same material. For example, the first 192 and fifth 196 intermediate films in the embodiment of FIG. 5 can both be formed of the same material (e.g., zinc oxide). As is also described in the above-noted International Application, each layer in the intermediate region 190 may advantageously have a different microstructure than each layer contiguous thereto (e.g., amorphous versus crystalline). For example, it may be particularly advantageous to form contiguous layers in the intermediate film region 190 of different materials.

In one embodiment, the intermediate film region 190 comprises the following films: (1) a first layer 192 of zinc oxide at a thickness of about 50–200 Å, perhaps optimally about 105 Å; (2) a second layer 193 of silicon nitride at a thickness of about 50–200 Å, perhaps optimally about 140 Å; (3) a third layer 194 of zinc oxide at a thickness of about 50–300 Å, perhaps optimally about 200 Å; (4) a fourth layer 195 of silicon nitride at a thickness of about 50–200 Å, perhaps optimally about 140 Å; and (5) a fifth layer 196 of zinc oxide at a thickness of about 50–200 Å, perhaps optimally about 80 Å. If so desired, any one or more of the zinc oxide layers can be formed of an alloy or mixture comprising zinc oxide, such as a mixture of zinc oxide and bismuth oxide, tin oxide, or indium oxide. However, it is preferable to form at least the outermost portion of the fifth layer 196 of zinc oxide since, as noted above, zinc oxide is believed to provide a good foundation for the nucleation of silver (which may be deposited directly upon this layer 196). For example, the fifth layer 196 in this embodiment may include a first oxide film with a thickness of about 20 Å, such as an oxide of zinc alloy, and a second film of an oxide of zinc alone at about 60 Å.

Thus, a preferred embodiment of the invention provides a low-emissivity coating that includes at least one protective niobium-titanium layer and an intermediate film region 190 comprising at least three, and preferably at least five, discrete transparent dielectric layers (optimally limited in thickness and wherein each layer has a different microstructure than each layer contiguous thereto, as described above). Low-emissivity coatings with this combination of features should perform exceptionally well under "adhesion failure with moisture testing", such as that described in the above-noted International Application. Such coatings should also have desirable scratch resistance and should exhibit very little noticeable color shift and haze formation during tempering or other heat treatment.

In embodiments like that described in the preceding paragraph, a titanium nitride film can be incorporated into the outer film region 90, 130 of the low-emissivity coating. Accordingly, one particularly preferred low-emissivity coating includes at least one protective niobium-titanium layer, an intermediate film region comprising discrete multiple transparent dielectric films (as described above), and an outer titanium nitride film (i.e., a titanium nitride film as the outermost layer, or elsewhere in the outer film region 90, 130). Alternatively, at least one chemically-durable outer film can be incorporated into embodiments like that described in the preceding paragraph. Thus, another particularly preferred low-emissivity coating includes at least one protective niobium-titanium layer, an intermediate film region comprising discrete multiple transparent dielectric films (as described above), and at least one chemically-durable outer film (e.g., $Si_3N_4$). Further, in embodiments like that described in the preceding paragraph, there can be provided an outer titanium nitride film and a chemically-durable outer film. Thus, an especially preferred low-emissivity coating includes at least one protective niobium-titanium layer, an intermediate film region comprising discrete multiple transparent dielectric films (as described), an outer titanium nitride film, and a chemically-durable outer film (e.g., a silicon nitride film as the outermost layer, or elsewhere in the outer film region 90, 130).

FIGS. 4–9 depict "double" type low-emissivity coatings. Thus, a second infrared-reflective film 150 is provided in each of these embodiments. The materials useful in forming the first infrared-reflective film 50 are also useful in the forming second infrared-reflective film 150. In most cases, both infrared-reflective films 50, 150 will be formed of the same material, although this is not a requirement. Preferably, both films 50, 150 are silver or silver-containing films, with the second, outermost film 150 being somewhat thicker than the first, innermost film 50. For example, a preferred embodiment provides a first infrared-reflective layer 50 of silver at a thickness of between about 50 Å and about 150 Å, more preferably between about 58 Å and about 90 Å, perhaps optimally about 80 Å, and a second infrared-reflective layer 150 of silver at a thickness of between about 90 Å and about 180 Å, more preferably between about 96 Å and 155 Å, perhaps optimally at about 130 Å.

As illustrated in FIG. 4, a protective niobium-titanium layer 180 can be provided advantageously over the second infrared-reflective film 150. This niobium-titanium layer 180 is of the nature described above. For example, this layer 180 is preferably formed directly upon the underlying infrared-reflective film 150. Further, the thickness of this niobium-titanium layer 180 is preferably between about 7–30 Å, more preferably between about 15–22 Å, and perhaps optimally about 20 Å. In certain embodiments, both protective layers 80, 180 are niobium-titanium films each deposited at a thickness of about 15–22 Å. An additional protective layer can be positioned directly beneath the second infrared-reflective layer 150, if so desired. Moreover, one of the protective layers 80, 180 can be omitted entirely, if so desired.

With continued reference to FIG. 4, an outer film region 130 is positioned outwardly from the second infrared-reflective film 150 (e.g., directly upon the second protective layer 180, if present). The exact nature of the outer film region 130 can be varied as desired. In its simplest form, the outer film region 130 consists of a single transparent dielectric film. A wide variety of metal nitrides (e.g., silicon nitride) and metal oxides (e.g., oxides of zinc, tin, indium, bismuth, titanium, hafnium, zirconium, and alloys and mixtures thereof) can be used as the outermost layer of a low-emissivity coating. In one embodiment, the outer film region 130 is a single film (e.g., silicon nitride) having a thickness of between about 100 Å and about 400 Å, more preferably between about 100 Å and about 300 Å, and perhaps optimally about 280 Å. Those skilled in the art would be able to readily select other materials suitable for use as the outer film region 130.

It may be preferable to employ an outer film region 130 comprising a plurality of separate layers. For example, a variety of film stacks are known to be suitable for use as the outer film region of a "double" type low-emissivity coating. It may be preferable to limit each layer of the outer film region 130 to a physical thickness of no more than about 250 Å, or more preferably to no more than about 225 Å, or to an optical thickness of no more than about 450 Å. Moreover, it is believed to be advantageous if each layer in the outer film region 130 is formed of a different material than each layer contiguous thereto. As noted above with reference to the intermediate film region 190, this may reduce the likelihood that objectionable haze will develop during tempering or other heat treatment.

Figure 6:
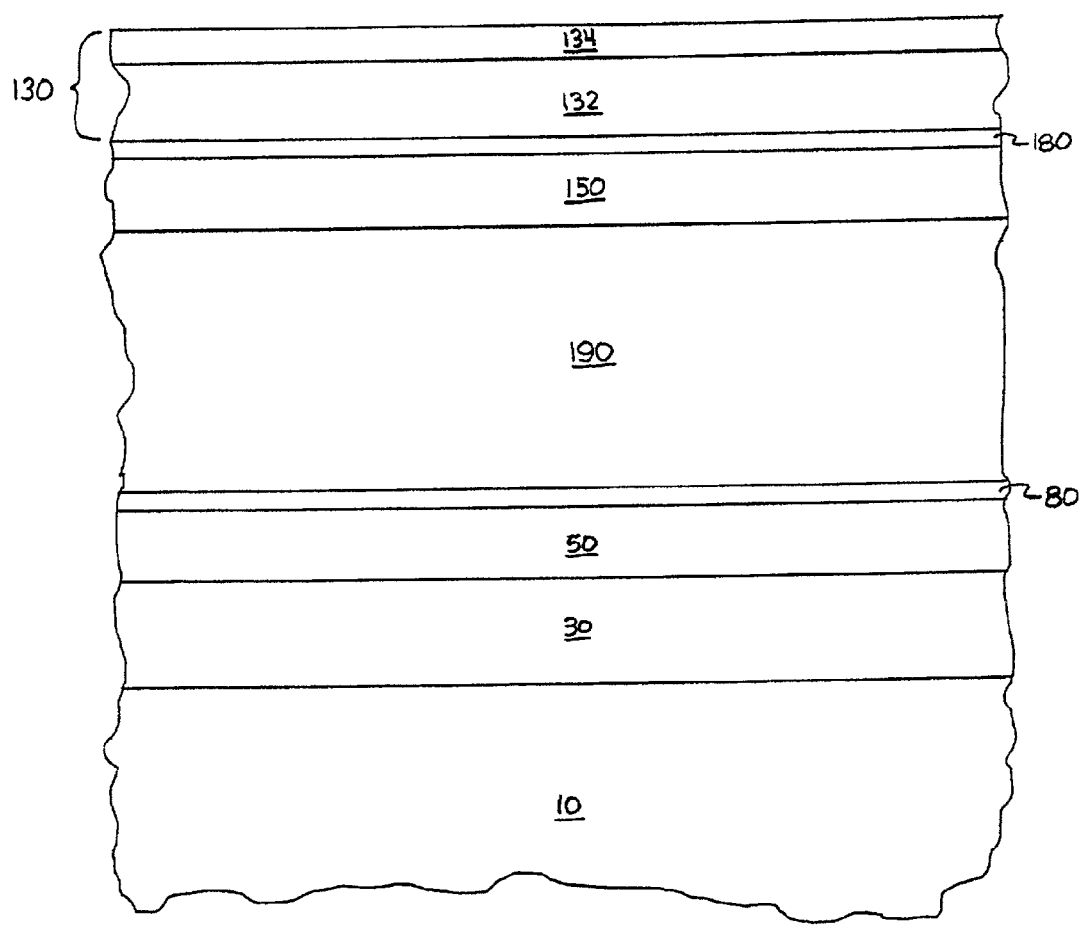
FIG. 6 is a schematic, cross sectional view of a substrate carrying a film stack in accordance with another embodiment of the invention.
Figure 7:
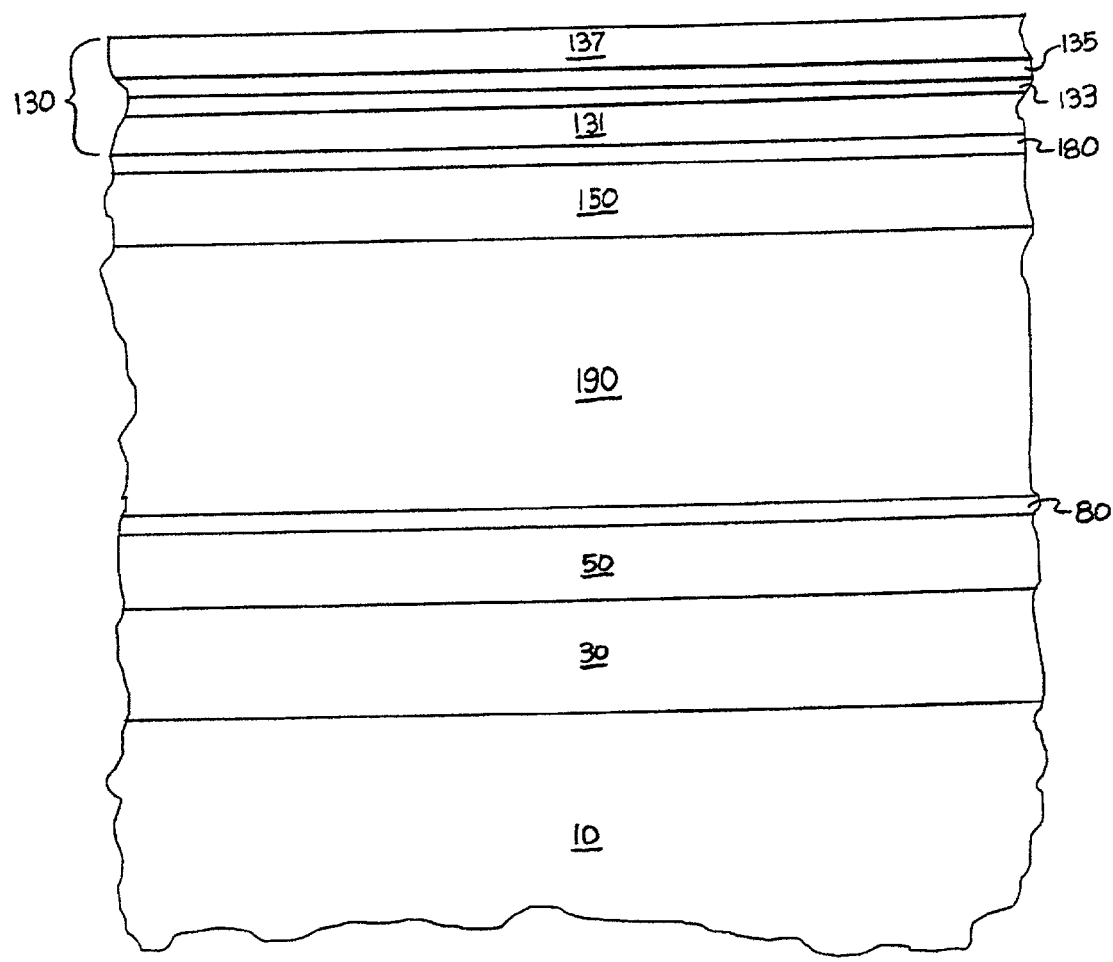
FIG. 7 is a schematic, cross sectional view of a substrate carrying a film stack in accordance with still another embodiment of the invention.

FIGS. 6 and 7 illustrate embodiments wherein the outer film region 130 is formed of a plurality of separate layers. For example, the embodiment of FIG. 6 has an outer film region 130 comprising two separate layers. In the illustrated embodiment, a first outer layer 132 is deposited directly upon the second protective layer 180. The first outer layer 132 can be formed of any desired transparent dielectric material. For example, this layer 132 can be advantageously formed of zinc oxide. The thickness of the first outer layer 132 is preferably between about 125 Å and about 275 Å, and more preferably between about 150 Å and about 250 Å. In the illustrated embodiment, a second outer layer 134 is deposited directly upon the first outer layer 132. While this layer 134 can be formed of any desired transparent dielectric material, it is preferably formed of a chemically-durable material, such as silicon nitride. The thickness of the second outer layer 134 is preferably between about 25 Å and about 300 Å, and more preferably between about 50 Å and about 125 Å. In one preferred embodiment, the first outer layer 132 is formed of zinc oxide at a thickness of about 175 Å and the second outer layer 134 is formed of silicon nitride at a thickness of about 75 Å. In yet another embodiment, the outer film region 130 comprises two or more films, including at least one titanium nitride film and at least one chemically-durable film (e.g., silicon nitride), with the chemically-durable film preferably, though not necessarily, being positioned outwardly from the titanium nitride film.

FIG. 7 illustrates a preferred embodiment wherein the outer film region 130 comprises at least four separate layers. These layers 131, 133, 135, 137 can be formed of any desired transparent dielectric materials. For example, directly upon the second protective layer 180 may be deposited a film layer 131 formed of an alloy or mixture of zinc oxide, such as an alloy or mixture of zinc oxide and bismuth oxide, tin oxide, or indium oxide. This film layer 131 is preferably deposited at a thickness of between about 50 Å and about 200 Å, more preferably between about 80 Å and about 115 Å, and perhaps optimally about 100 Å. In this embodiment, it is particularly preferred to sandwich a titanium nitride layer 135 between first 133 and second 137 chemically-durable layers (e.g., silicon nitride), and to position this sandwich directly upon the film layer 131. In more detail, the innermost 133 of these silicon nitride layers preferably has a thickness on the order of about 22–55 Å, perhaps optimally about 30 Å. The titanium nitride layer 135 preferably has a thickness on the order of about 4–41 Å, perhaps optimally about 10 Å. The outermost silicon nitride layer 137 preferably has a thickness of about 75–179 Å, perhaps optimally about 110 Å.

Given the teachings of the present disclosure, it will be appreciated that certain preferred embodiments of the invention provide a low-emissivity coating having at least one infrared-reflective layer, wherein there is found a contiguous sequence of, moving outwardly, a zinc oxide film, an a silver or silver-containing film, and a niobium-titanium layer. The silver or silver-containing film in this contiguous sequence is positioned directly over the zinc oxide film and directly beneath the niobium-titanium layer. If so desired, one or more additional films (e.g., silicon dioxide) may be provided inwardly from the zinc oxide film in this sequence. Further, a transparent dielectric film is preferably positioned over the niobium-titanium layer in this sequence. It is noted that the silver or silver-containing film in this sequence may be the only infrared-reflective film in the coating, or it may be one of two or more infrared-reflective films in the coating.

One particular embodiment of the invention will now be described. This embodiment involves a "double" type low-emissivity coating. The layers of this coating will be described in order, moving outwardly (i.e., in a direction away from the substrate). Directly upon the substrate, there is formed a layer of an alloy or mixture of zinc oxide, such as an alloy or mixture of zinc oxide and bismuth oxide, tin oxide, or indium oxide, is formed directly upon the base layer. This oxide layer preferably has a thickness of between about 250 Å and about 350 Å, perhaps optimally about 300 Å. Directly upon this oxide layer is applied a layer of pure zinc oxide. The thickness of this zinc oxide layer is preferably between about 70 Å and about 100 Å, perhaps optimally about 85 Å. An infrared-reflective silver layer is formed directly upon this zinc oxide layer. This silver layer preferably has a thickness of between about 90 Å and about 110 Å, perhaps optimally about 100 Å. A protective niobium-titanium layer is then applied directly upon this silver layer. The majority of this niobium-titanium may be oxidized or nitrided during the deposition of subsequent layers, as described above. The niobium-titanium of this layer is preferably deposited at a thickness of between about 20 Å and about 30 Å, perhaps optimally about 25 Å. Directly upon this niobium-titanium layer is applied a layer of pure zinc oxide, which layer preferably has a thickness of between about 80 Å and about 120 Å, perhaps optimally about 100 Å. Directly upon this zinc oxide layer is applied a layer of an alloy or mixture of zinc oxide, such as an alloy or mixture of zinc oxide and bismuth oxide, tin oxide, or indium oxide. This oxide layer preferably has a thickness of between about 530 Å and about 620 Å, and more preferably between about 550 Å and about 700 Å. Directly upon this oxide layer is formed a layer of pure zinc oxide, which layer preferably has a thickness of between about 65 Å and about 105 Å, perhaps optimally about 85 Å. An infrared-reflective silver layer is formed directly upon this zinc oxide layer. This silver layer preferably has a thickness of between about 105 Å and about 145 Å, perhaps optimally about 125 Å. A protective niobium-titanium layer, which may subsequently be oxidized or nitrided, is then applied directly upon this silver layer. The niobium-titanium of this layer is preferably deposited at a thickness of between about 20 Å and about 30 Å, perhaps optimally about 20 Å. Directly upon this niobium-titanium layer is applied a layer of pure zinc oxide, which layer preferably has a thickness of between about 110 Å and about 130 Å, perhaps optimally about 120 Å. Directly upon this zinc oxide layer is deposited a layer of an alloy or mixture of zinc oxide, such as an alloy or mixture of zinc oxide and bismuth oxide, tin oxide, or indium oxide. This oxide layer preferably has a thickness of between about 130 Å and about 170 Å, perhaps optimally about 150 Å. Directly upon this oxide layer is formed a layer of silicon nitride, which preferably forms the outermost layer of the film stack. Preferably, this silicon nitride layer has a thickness of between about 20 Å and about 50 Å, and more preferably between about 30 Å and about 40 Å. Those skilled in the art would be able to readily select and vary other suitable layer compositions and thicknesses that are outside these preferred ranges yet produce good results.

Another particular embodiment of the invention will now be described. This embodiment also involves a "double" type low-emissivity coating. The layers of this coating will be described in order, moving outwardly. Directly upon the substrate, there is formed a transparent base layer of silicon dioxide. The base layer preferably has a thickness of between about 70 Å and about 90 Å, perhaps optimally about 80 Å. Directly upon the silicon dioxide base layer is applied a layer of zinc oxide. The thickness of this zinc oxide layer is preferably between about 215 Å and about 245 Å, perhaps optimally about 230 Å. An infrared-reflective silver layer is applied directly upon this zinc oxide layer. This silver layer preferably has a thickness of between about 70 Å and about 90 Å, perhaps optimally about 80 Å. A protective niobium-titanium layer is then applied directly upon this silver layer. This niobium-titanium layer is preferably deposited at a thickness of between about 18 Å and about 22 Å, perhaps optimally about 20 Å. Directly upon this niobium-titanium layer is applied a layer of zinc oxide. This zinc oxide layer is preferably deposited at thickness of between about 95 Å and about 115 Å, perhaps optimally about 105 Å. A silicon nitride layer is then applied directly upon this zinc oxide layer. This silicon nitride layer preferably has a thickness of between about 120 Å and about 160 Å, perhaps optimally about 140 Å. Directly upon this silicon nitride layer is applied a layer of zinc oxide at a thickness of between about 180 Å and about 220 Å, perhaps optimally about 200 Å. A silicon nitride layer is then applied directly upon this zinc oxide layer. This silicon nitride layer preferably has a thickness of between about 120 Å and about 160 Å, perhaps optimally about 140 Å. Directly upon this silicon nitride layer is applied zinc oxide at a thickness of between about 65 Å and about 95 Å, perhaps optimally about 80 Å. An infrared-reflective silver layer is formed directly upon this zinc oxide. This silver layer preferably has a thickness of between about 110 Å and about 150 Å, perhaps optimally about 130 Å. A protective niobium-titanium layer is applied directly upon this silver layer. This niobium-titanium layer is preferably deposited at a thickness of between about 18 Å and about 22 Å, perhaps optimally about 20 Å. Directly upon this niobium-titanium layer is applied a layer of zinc oxide. This zinc oxide layer preferably has a thickness of between about 90 Å and about 110 Å, perhaps optimally about 100 Å. A silicon nitride layer is then deposited directly upon this zinc oxide layer. This silicon nitride layer preferably has a thickness of between about 20 Å and about 40 Å, perhaps optimally about 30 Å. A layer of titanium nitride is then formed directly upon this silicon nitride layer. This titanium nitride layer preferably has a thickness of between about 5 Å and about 15 Å, perhaps optimally about 10 Å. Directly upon this titanium nitride layer is applied a silicon nitride film. This silicon nitride film preferably has a thickness of between about 85 Å and about 135 Å, perhaps optimally about 110 Å. This silicon nitride film is the outermost layer of the film stack.

Yet another embodiment of the invention will now be described. The layers of this coating, which is also a "double" type low-emissivity coating, will be described in order, moving outwardly. A layer of titanium oxide (e.g., titanium dioxide, which may be substoichiometric $TiO_x$, where x is between 1 and 2) is applied directly upon the substrate. This titanium oxide layer preferably has a thickness of between about 115 Å and about 145 Å, perhaps optimally about 130 Å. Directly upon this titanium oxide layer is applied a layer of pure zinc oxide. The thickness of this zinc oxide layer is preferably between about 40 Å and about 60 Å, perhaps optimally about 50 Å. An infrared-reflective silver layer is formed directly upon this zinc oxide layer. This silver layer preferably has a thickness of between about 80 Å and about 100 Å, perhaps optimally about 90 Å. A protective niobium-titanium layer is formed directly upon this silver layer. This protective niobium-titanium layer, which may subsequently be oxidized or nitrided, is preferably deposited at a thickness of between about 20 Å and about 30 Å, perhaps optimally about 25 Å. Directly upon this protective niobium-titanium layer is applied a layer of silicon nitride, which layer preferably has a thickness of between about 400 Å and about 700 Å, perhaps optimally about 500 Å. Directly upon this silicon nitride layer is applied a layer of pure zinc oxide. This zinc oxide layer preferably has a thickness of between about 30 Å and about 50 Å, perhaps optimally about 40 Å. Directly upon this zinc oxide layer is formed a layer of infrared-reflective silver layer. This silver layer preferably has a thickness of between about 80 Å and about 130 Å, and more preferably between about 100 Å and about 110 Å. A protective niobium-titanium layer is formed directly upon this silver layer. This protective niobium-titanium layer, which may subsequently be oxidized or nitrided, is preferably deposited at a thickness of between about 20 Å and about 30 Å, perhaps optimally about 25 Å Directly upon this protective niobium-titanium layer is applied a layer of silicon nitride, which preferably forms the outermost layer of the film stack. The preferred thickness range for this silicon nitride layer is between about 250 Å and about 310 Å, perhaps optimally about 280 Å. Those having ordinary skill in the present art would be able to readily select and vary other suitable layer compositions and thicknesses that are outside these preferred ranges yet produce acceptable results.

Figure 8:
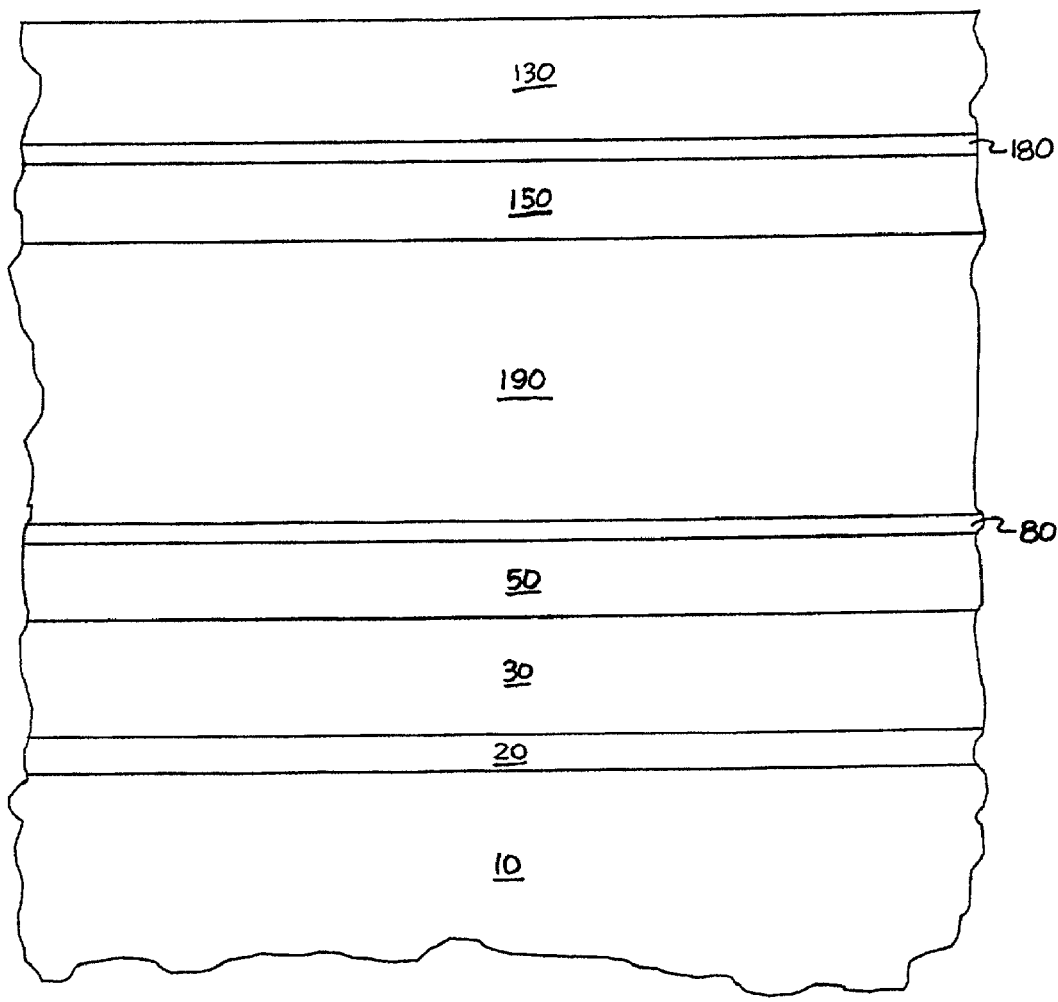
FIG. 8 is a schematic, cross sectional view of a substrate carrying a film stack in accordance with yet another embodiment of the invention.

FIG. 8 illustrates a "double" type low-emissivity coating that is particularly preferred. In this embodiment, the layer structure of the coating can be like any of those described herein with reference to FIGS. 4–7, with the provision of a transparent base layer 20 between the substrate 10 and the antireflective layer 30. The transparent base layer 20 is of the nature described above with reference to FIG. 3. For example, this base layer 20 can be provided to minimize problems (e.g., haze formation during tempering) associated with substrate defects (e.g., moisture corrosion). As noted above, low-emissivity coatings that include at least one protective niobium-titanium layer and a transparent base layer 20 should exhibit very little noticeable color shift and very little haze formation during tempering or other heat treatment (even when subjected to temperatures on the order of about 700 degrees C.). Thus, coatings with this combination of features should be particularly well suited for use on substrates that are to be tempered or otherwise heat treated. Coatings of this nature should have desirable scratch resistance as well.

Figure 9:
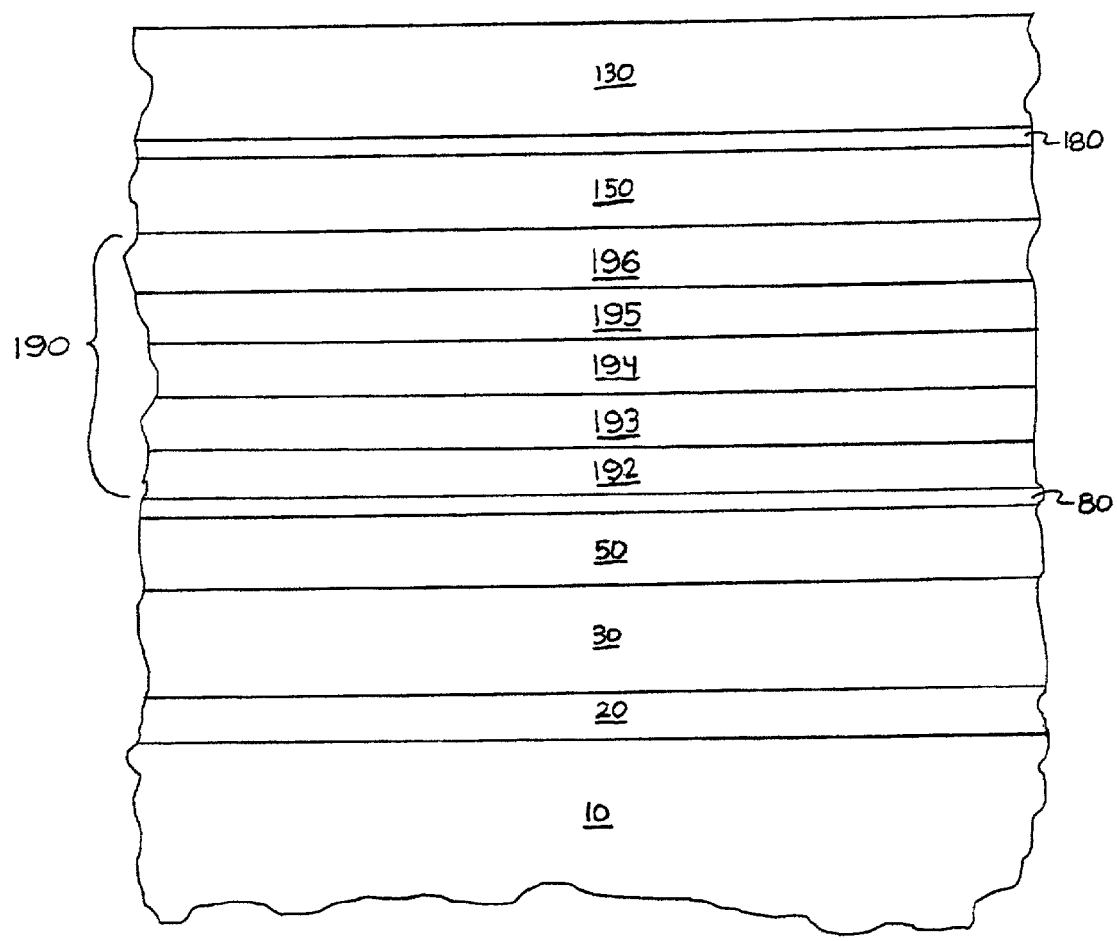
FIG. 9 is a schematic, cross sectional view of a of a substrate carrying a film stack in accordance with a further embodiment of the invention.

It is believed to be especially desirable to provide a low-emissivity coating with a combination of at least one protective niobium-titanium layer, an intermediate film region 190 comprising discrete multiple transparent dielectric layers (as described above), and a transparent base layer 20. FIG. 9 illustrates one embodiment of this nature. Low-emissivity coatings with this unique combination of features should perform exceptionally well under "adhesion failure with moisture testing", such as that described in the above-noted International Application. They should also exhibit very little noticeable color shift and minimal haze formation during tempering or other heat treatment. Further, these coatings should have desirable scratch resistance. Thus, coatings with this combination of features are especially preferred.

In embodiments like that described in the preceding paragraph, a titanium nitride film can be incorporated advantageously into the outer film region 90, 130. Thus, one desirable low-emissivity coating includes at least one protective niobium-titanium layer, an intermediate film region 190 comprising discrete multiple transparent dielectric layers (as described), a transparent base layer 20, and a titanium nitride outer film (e.g., a titanium nitride film as the outermost layer, or elsewhere in the outer film region 90, 130). Alternatively, at least one chemically-durable outer film can be incorporated into a coating of the nature described in the preceding paragraph. The chemically-durable film or films may be formed of silicon nitride. Thus, another desirable low-emissivity coating includes at least one protective niobium-titanium layer, an intermediate film region 190 comprising discrete multiple transparent dielectric layers, a transparent base layer 20, and at least one chemically-durable outer film (e.g., a silicon nitride film as the outermost layer, or elsewhere in the outer film region 90, 130). Further, in embodiments like that described in the preceding paragraph, there can be provided both an outer titanium nitride film and a chemically-durable outer film (e.g., silicon nitride). Thus, a particularly desirable low-emissivity coating includes at least one protective niobium-titanium layer, an intermediate film region 190 comprising discrete multiple transparent dielectric layers, a transparent base layer 20, an outer titanium nitride film, and a chemically-durable outer film.

As noted above, FIGS. 4–9 depict "double" type low-emissivity coatings, which include two infrared-reflective films 50, 150. In the embodiments of FIGS. 4–9, a protective niobium-titanium layer is shown over each of the infrared-reflective films 50, 150. While embodiments of this nature are expected to be particularly advantageous, the invention provides a number of alternate embodiments. In a further embodiment (not shown), a protective niobium-titanium layer is provided over only one of the infrared-reflective films 50, 150. In some cases, this may involve a coating wherein only the first infrared-reflective film 50 is provided with an overlying niobium-titanium layer 80. In these cases, the second infrared-reflective film 150 can be provided with an overlying protective film 180 of another material (e.g., titanium, niobium, nickel, chromium, nichrome, etc.), or the second protective layer 180 can be omitted entirely. In other cases, this may involve a coating wherein only the second infrared-reflective film 150 is provided with an overlying niobium-titanium layer 180. In these cases, the inner infrared-reflective layer 50 can be provided with an overlying protective layer 80 of another material, or the first protective layer 80 can be omitted entirely.

In another embodiment (not shown), each of the infrared-reflective films 50, 150 in a "double" type low-emissivity coating is sandwiched between protective niobium-titanium layers. In such an embodiment, the niobium-titanium layer beneath each infrared-reflective film may be several angstroms thinner than the niobium-titanium layer over such infrared-reflective film (e.g., to prevent undue reduction in transmissivity). As noted above, it may be advantageous not to position niobium-titanium layers directly beneath infrared-reflective films, at least if silver is used in the infrared-reflective films, since a directly underlying zinc oxide film tends to optimize silver growth. However, sandwiching infrared-reflective films, even those formed of silver, directly between niobium-titanium layers may provide a desirable level of protection for the infrared-reflective films. Thus, embodiments of this nature may be desirable.

In certain embodiments (not shown), there is provided a "double" type low-emissivity coating wherein only one of the infrared-reflective films is sandwiched between two niobium-titanium layers. In some cases, this may involve a coating wherein only the first infrared-reflective film 50 is sandwiched between two protective niobium-titanium layers. In these cases, the second infrared-reflective film 150 may have only an overlying niobium-titanium protective layer 180 (or only an overlying protective layer 180 of another material), only an underlying niobium-titanium protective layer (or only an underlying protective layer of another material), or no protective layer whatsoever. In other cases, this may involve a coating wherein only the second infrared-reflective film 150 is sandwiched between protective niobium-titanium layers. In these cases, the first infrared-reflective film 50 may have only an overlying niobium-titanium protective layer 80 (or only an overlying protective layer 80 of another material), only an underlying niobium-titanium protective layer (or only an underlying protective layer of another material), or no protective layer whatsoever.

A variety of other embodiments will be obvious to skilled artisans given the present disclosure as a guide. For example, a protective niobium-titanium layer can be positioned beneath, but not above, each infrared-reflective film in a low-emissivity coating. In another embodiment, a low-emissivity coating having at least two infrared-reflective films is provided with a single protective niobium-titanium layer. This niobium-titanium layer may be positioned over, or beneath, any one of the infrared-reflective films in the coating. For example, there can be provided a low-emissivity coating that includes one or more infrared-reflective films and at least one niobium-titanium layer that is contiguous to an infrared-reflective film of the coating.

The embodiments detailed in this disclosure have a great number of possible variations, which will be apparent to those skilled in the art and which fall within the scope of the invention. For example, a number of film stack portions (e.g., inner film regions 30, intermediate film regions 190, outer film regions 90, 130, and particular film sequences) are described herein as being incorporated into a "single" or "double" type low-emissivity coating. However, any one or more of these film stack portions can be incorporated into low-emissivity coatings that include three or more infrared-reflective films. For example, there can be provided a low-emissivity coating having three or more infrared-reflective films wherein a protective niobium-titanium layer is positioned over each infrared-reflective film. There can also be provided a low-emissivity coating having three or more infrared-reflective films wherein each infrared-reflective film is sandwiched between two niobium-titanium layers. Skilled artisans will appreciate that the invention encompasses a number of other variations of this nature.

In certain embodiments, the invention provides a glass pane carrying one of a variety of different film stacks. The transmissivity (Illuminant C) of the described film stacks is at least about 65%, and in preferred embodiments (as described) is at least about 78%. The composition and thickness of each infrared-reflective film, each transparent dielectric film, and each protective film is selected, as set forth in examples above, to achieve such transmissivity levels.

While preferred embodiments of the present invention have been described, it should be understood that numerous changes, adaptations, and modifications can be made therein without departing from the spirit of the invention and the scope of the appended claims.

What is claimed is:

1. A substrate having a first index of refraction bearing a low-emissivity coating, the low-emissivity coating comprising, moving outwardly:
   a) a first film layer comprising a transparent dielectric material;
   b) a second film layer comprising an infrared-reflective material;
   c) a third, protective film layer comprising niobium and titanium wherein the protective film layer is formed directly upon the second film layer; and
   d) a fourth film layer comprising a transparent dielectric material,
   wherein the low-emissivity coating includes a transparent base layer positioned between the substrate and the first film layer, the transparent base layer comprising silicon dioxide having a thickness of less than 100 angstroms formed directly on the substrate and having a second index of refraction that is substantially equal to the first index of refraction of the substrate.

2. The substrate of claim 1 wherein the protective film layer contains a greater percentage of titanium than niobium, such that the protective film layer imparts abrasion resistance in the low-emissivity coating.

3. The substrate of claim 1 wherein the protective film layer contains a greater percentage of niobium than titanium, such that the protective film layer imparts in the low-emissivity coating resistance to color shifting during exposure to elevated temperatures on the order of about 700°C.

4. The substrate of claim 1 wherein the infrared-reflective material of the second film layer is silver.

5. The substrate of claim 1 wherein the protective film layer has a thickness of between about 10 angstroms and about 30 angstroms.

6. The substrate of claim 1 wherein the first film layer comprises zinc oxide.

7. The substrate of claim 6 wherein the second film layer is formed directly upon the first film layer and the infrared-reflective material of the second film layer is silver.

8. The substrate of claim 1 wherein the fourth film layer comprises zinc oxide.

9. The substrate of claim 1 further comprising a titanium nitride layer further from the substrate than the fourth film layer.

10. The substrate of claim 1 further comprising a chemically-durable film further from the substrate than the fourth film layer, the chemically-durable film comprising silicon nitride.

11. The substrate of claim 1 further comprising a titanium nitride layer and a chemically-durable film, both being further from the substrate than the fourth film layer, wherein the chemically-durable film comprises silicon nitride.

12. The substrate of claim 1 further comprising:
a) a fifth film layer comprising an infrared-reflective material; and
b) a sixth film layer comprising a transparent dielectric material.

13. The substrate of claim 12 further comprising a protective film layer positioned between the fifth and sixth film layers, the protective film layer comprising niobium and titanium.

14. The substrate of claim 12 further comprising a titanium nitride layer further from the substrate than the sixth film layer.

15. The substrate of claim 12 further comprising a chemically-durable film further from the substrate than the sixth film layer, the chemically-durable film comprising silicon nitride.

16. The substrate of claim 12 further comprising a titanium nitride layer and a chemically-durable film, both being further from the substrate than the sixth film layer, wherein the chemically-durable film comprises silicon nitride.

17. A substrate bearing a low-emissivity coating that includes one or more infrared-reflective films, the low-emissivity coating including a transparent base layer comprising silicon dioxide having a thickness of less than 100 angstroms formed directly upon the substrate and having an index of refraction that is substantially equal to the index of refraction of the substrate, and a protective niobium-titanium layer that is formed directly upon an infrared-reflective film of the coating.

18. The substrate of claim 17 wherein the protective niobium-titanium layer contains a greater percentage of titanium than niobium, such that the protective niobium-titanium layer imparts abrasion resistance in the low-emissivity coating.

19. The substrate of claim 17 wherein the protective niobium-titanium layer contains a greater percentage of niobium than titanium, such that the protective niobium-titanium layer imparts in the low-emissivity coating resistance to color shifting during exposure to elevated temperatures on the order of about 700°C.

20. The substrate of claim 17 wherein said protected infrared-reflective film comprises silver.

21. The substrate of claim 17 wherein a transparent dielectric film is formed between the substrate and said protected infrared-reflective film.

22. The substrate of claim 21 wherein a transparent dielectric film is formed over the protective niobium-titanium layer.

23. The substrate of claim 17 wherein the low-emissivity coating includes a contiguous sequence of films, said contiguous sequence comprising, moving outwardly, a zinc oxide film, a silver or silver-containing film, and the protective niobium-titanium layer.

24. The substrate of claim 17 wherein the low-emissivity coating includes a sequence of films, said sequence comprising, moving outwardly, the protective niobium-titanium layer, a zinc oxide film, a silicon nitride film, a zinc oxide film, an infrared-reflective film, and a transparent dielectric film.

25. The substrate of claim 17 wherein the low-emissivity coating includes a sequence of films, said sequence comprising, moving outwardly, the protective niobium-titanium layer, a zinc oxide film, a silicon nitride film, a zinc oxide film, a silicon nitride film, a zinc oxide film, an infrared-reflective film, and a transparent dielectric film.

26. A transparent glass substrate having a first index of refraction, the substrate bearing a low-emissivity coating comprising, moving outwardly:
a) a transparent base layer comprising silicon dioxide having a thickness of less than 100 angstroms and having a second index of refraction that is substantially equal to the first index of refraction of the substrate;
b) a second film layer comprising a transparent dielectric material;
c) a third film layer comprising an infrared-reflective material;
d) a fourth, protective film layer comprising niobium and titanium; and
e) a fifth film layer comprising a transparent dielectric material.

27. The substrate of claim 26 wherein the protective film layer contains a greater percentage of titanium than niobium, such that the protective film layer imparts abrasion resistance in the low-emissivity coating.

28. The substrate of claim 26 wherein the protective film layer contains a greater percentage of niobium than titanium, such that the protective film layer imparts in the low-emissivity coating resistance to color shifting during exposure to elevated temperatures on the order of about 700°C.

29. The substrate of claim 26 wherein the transparent base layer is formed directly upon the substrate.

30. The substrate of claim 26 wherein the transparent base layer has a thickness of between about 50 angstroms and about 90 angstroms.

31. The substrate of claim 30 wherein said first index of refraction of the substrate is between about 1.4 and about 1.5.

32. The substrate of claim 26 wherein said second index of refraction of the amorphous film of the transparent base layer is less than about 1.7.

33. The substrate of claim 26 wherein the infrared-reflective material of the third film layer is silver.

34. The substrate of claim 26 wherein the protective film layer has a thickness of between about 10 angstroms and about 30 angstroms.

35. The substrate of claim 26 further comprising a titanium nitride layer further from the substrate than the fifth film layer.

36. The substrate of claim 26 further comprising a chemically-durable film layer further from the substrate than the fifth film layer, the chemically-durable film layer comprising silicon nitride.

37. The substrate of claim 26 further comprising a titanium nitride layer and a chemically-durable film, both being further from the substrate than the fifth film layer, wherein the chemically-durable film layer comprises silicon nitride.

38. A substrate bearing a low-emissivity coating, the low-emissivity coating comprising, moving outwardly:
a) a first film layer comprising a transparent dielectric material;
b) a second film layer comprising an infrared-reflective material;
d) an intermediate film region comprising at least three film layers;
f) a sixth film layer comprising an infrared-reflective material;
g) a seventh film layer comprising a transparent dielectric material;
wherein the low-emissivity coating includes a transparent base layer positioned between the substrate and the first film layer, the transparent base layer comprising silicon dioxide having a thickness of less than 100 angstroms formed directly on the substrate and having an index of refraction that is substantially equal to the index of refraction of the substrate, and a protective niobium-titanium layer that is contiguous either to said second film layer or to said sixth film layer.

39. The substrate of claim 38 wherein the protective niobium-titanium layer contains a greater percentage of titanium than niobium, such that the protective niobium-titanium layer imparts abrasion resistance in the low-emissivity coating.

40. The substrate of claim 38 wherein the protective niobium-titanium layer contains a greater percentage of niobium than titanium, such that the protective niobium-titanium layer imparts in the low-emissivity coating resistance to color shifting during exposure to elevated temperatures on the order of about 700°C.

41. The substrate of claim 38 wherein the protective niobium-titanium layer is formed directly over either said second film layer or said sixth film layer.

42. The substrate of claim 38 wherein the low-emissivity coating includes two protective niobium-titanium layers formed respectively directly over said second film layer and said sixth film layer.

43. The substrate of claim 38 wherein the protective niobium-titanium layer has a thickness of between about 10 angstroms and about 30 angstroms.

44. The substrate of claim 38 wherein each of said three film layers in the intermediate film region has a physical thickness of no more than about 250Å.

45. The substrate of claim 38 wherein each of said three film layers in the intermediate film region is formed of a different material than each film layer contiguous thereto.

46. The substrate of claim 38 wherein the intermediate film region comprises three film layers respectively comprising zinc oxide, silicon nitride, and zinc oxide.

47. The substrate of claim 46 wherein said silicon nitride film layer is positioned between said zinc oxide film layers.

48. The substrate of claim 38 wherein the intermediate film region comprises at least five film layers.

49. The substrate of claim 48 wherein the intermediate film region comprises alternating film layers of zinc oxide and silicon nitride.

50. The substrate of claim 49 wherein the intermediate film region comprises three zinc oxide film layers and two silicon nitride film layers.

51. The substrate of claim 38 further comprising a titanium nitride layer further from the substrate than the seventh film layer.

52. The substrate of claim 38 further comprising a titanium nitride layer and a chemically-durable film, both being further from the substrate than the seventh film layer, wherein the chemically-durable film layer comprises silicon nitride.

53. A substrate having a first index of refraction bearing a low-emissivity coating, the coating comprising, moving outwardly:
a) a first film layer comprising an oxide of zinc and tin;
b) a second film layer comprising an oxide of zinc alone;
c) a third film layer comprising an infrared-reflective material;
d) a fourth film layer comprising niobium and titanium formed directly upon the third film layer;
e) a fifth film layer comprising an oxide of zinc alone;
f) a sixth film layer comprising an oxide of zinc and tin;
g) a seventh film layer comprising an oxide of zinc alone;
h) an eighth film layer comprising an infrared-reflective material;
i) a ninth film layer comprising niobium and titanium formed directly upon the eighth film layer;
j) a tenth film layer comprising an oxide of zinc alone;
k) an eleventh film layer comprising an oxide of zinc and tin; and
l) a twelfth film layer comprising a transparent dielectric materials
wherein the low-emissivity coating includes a transparent base layer positioned between the substrate and the first film layer, the transparent base layer comprising silicon dioxide having a thickness of less than 100 angstroms and having a second index of refraction that is substantially equal to the first index of refraction of the substrate.

54. A substrate having a first index of reflection bearing a low-emissivity coating, the low-emissivity coating comprising, moving outwardly from the substrate:
a) a first film layer comprising an oxide of titanium;
b) a second film layer comprising an oxide of zinc alone;
c) a third film layer comprising an infrared-reflective material;
d) a fourth film layer comprising niobium and titanium formed directly upon the third film layer;
e) a fifth film layer comprising silicon nitride;
f) a sixth film layer comprising an oxide of zinc alone;
g) a seventh film layer comprising an infrared-reflective material;
h) an eighth film layer comprising niobium and titanium formed directly upon the seventh film layer; and
i) a ninth film layer comprising a transparent dielectric materials,
wherein the low-emissivity coating includes a transparent base layer positioned between the substrate and the first film layer, the transparent base layer comprising silicon dioxide having a thickness of less than 100 angstroms and having a second index of refraction that is substantially equal to the first index of refraction of the substrate.

55. A substrate having a first index of refraction bearing a low-emissivity coating, the low-emissivity coating comprising, moving outwardly:
a) a first film layer comprising a transparent dielectric material;
b) a second film layer comprising an infrared-reflective material;
d) an intermediate film region comprising a plurality of intermediate films each having a physical thickness of less than 200 Angstroms, wherein at least one of the intermediate films is silicone nitride or another film that is amorphous or substantially amorphous;
f) a sixth film layer comprising an infrared-reflective material;
g) a seventh film layer comprising a transparent dielectric material;
wherein the low-emissivity coating includes a transparent base layer positioned between the substrate and the first film layer, the transparent base layer comprising silicon dioxide having a thickness of less than 100 Angstroms formed directly on the substrate and having a second index of refraction that is substantially equal to the first index of refraction of the substrate, and a protective niobium-titanium layer that is contiguous either to said second film layer or to said sixth film layer.

56. The glass sheet substrate of claim 55 wherein the intermediate film region includes five separate layers.

57. The substrate of claim 55 wherein the composition and thickness of each infrared-reflective film, each transparent dielectric film, and each protective film is selected so that the coating achieves an illuminant C transmissivity of at least about 78%.

58. The substrate of claim 56 wherein the intermediate film region has a combined thickness of about 400 to about 1200 Angstroms.

59. The substrate of claim 55 wherein the substrate is glass.

60. The substrate of claim 58 wherein the substrate is glass.

61. The substrate of claim 57 wherein the substrate is glass.

62. A substrate having a first index of refraction bearing a low-emissivity coating, the low-emissivity coating comprising, moving outwardly:
   a) a first film layer comprising a transparent dielectric material;
   b) a second film layer comprising an infrared-reflective material;
   d) an intermediate film region comprising at least three film layers;
   f) a sixth film layer comprising an infrared-reflective material;
   g) a seventh film layer comprising a transparent dielectric material;
   h) an outermost film comprising silicone nitride $SI_3 N_4$.

wherein the low-emissivity coating includes a transparent base layer positioned between the substrate and the first film layer, the transparent base layer comprising silicon dioxide having a thickness of less than 100 Angstroms formed directly on the substrate and having a second index of refraction that is substantially equal to the first index of refraction of the substrate, and a protective niobium-titanium layer that is contiguous either to said second film layer or to said sixth film layer.

63. The substrate of claim 62 wherein the intermediate film region has a combined thickness of about 400 to about 1200 Angstroms.

64. The substrate of claim 62 wherein the substrate is glass.

65. The substrate of claim 63 wherein the substrate is glass.

66. The substrate of claim 62 wherein the composition and thickness of each infrared-reflection film, each transparent dielectric film, and each protective film is selected so that the coating achieves illuminant C transmissivity of at least about 78%.

67. The substrate of claim 66 wherein the substrate is glass.

* * * * *